(12) United States Patent
Reznik

(10) Patent No.: US 8,004,431 B2
(45) Date of Patent: Aug. 23, 2011

(54) FAST PARSING OF VARIABLE-TO-FIXED-LENGTH CODES

(75) Inventor: Yuriy Reznik, Seattle, WA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/631,215

(22) Filed: Dec. 4, 2009

(65) Prior Publication Data

US 2010/0141489 A1 Jun. 10, 2010

Related U.S. Application Data

(60) Provisional application No. 61/121,147, filed on Dec. 9, 2008.

(51) Int. Cl.
*H03M 7/40* (2006.01)
(52) U.S. Cl. .......................... 341/67; 341/50
(58) Field of Classification Search .................. 341/67, 341/50, 51, 56
See application file for complete search history.

(56) References Cited

U.S. PATENT DOCUMENTS

| | | | | |
|---|---|---|---|---|
| 4,188,669 | A * | 2/1980 | Rauscher | 341/65 |
| 4,509,038 | A * | 4/1985 | Hirano | 341/67 |
| 6,839,005 | B1 * | 1/2005 | Singhal et al. | 341/67 |
| 2003/0236793 | A1 * | 12/2003 | Karlsson | 707/101 |
| 2008/0111721 | A1 | 5/2008 | Reznik | |
| 2008/0224905 | A1 | 9/2008 | Reznik | |
| 2010/0057810 | A1 * | 3/2010 | Ei et al. | 707/754 |

OTHER PUBLICATIONS

Algra, T.: "Fast and Efficient Variable-to-Fixed-Length Coding Algorithm," Electronics Letters, IEE Stevenage, GB, vol. 28, No. 15 (Jul. 16, 1992) pp. 1399-1401, XP000307687, ISSN: 0013-5194.

Anonymous: "Data Structures and Algorithms Topic 8: Introduction to trees"[Online] 1997, XP002595247 McGill University: School of Computer Science. Winter 1997 Class Notes for 308-251B Retrieved from the Internet: URL:http://www.cs.mcgi11.ca/{cs251/01dCo.

Gallager: "Variable to fixed length source coding—tunstall codes"[Online] 1994, XP002595245 Massachusetts Institute of Technology (Supplementary Notes) Retrieved from the Internet: URL:http://web.mit.edu/gal1ager/www/notes/ notesl.pdf> [retrieved on Aug. 3, 2010].

International Search Report and Written Opinion—PCT/US2009/067148, International Search Authority—European Patent Office—Sep. 7, 2010.

Julia Abrahams: "Code and parse trees for lossless source coding" [Online] vol. 1, No. 2, Apr. 2001, pp. 113-146, XP002595248, Communications in information and systems Retrieved from the Interner: URL:http://intlpress.cn/CIS/p/2001/1_2/CIS-1-2-113-146.pdf>.

T.J. Tjalkens: "A universal variable-to-fixed length source code based on lawrence's algorithm"[Oniine] vol. 38, No. 2, Mar. 1992, pp. 247-253, XP002595249 IEEE Transactions on Information Theory Retrieved from the Internet: URL:http://refer.

International Preliminary Report on Patentability—PCT/US2009/067148, The International Bureau of WIPO—Geneva, Switzerland, Mar. 9, 2011.

* cited by examiner

*Primary Examiner* — Peguy JeanPierre
(74) *Attorney, Agent, or Firm* — Steven Thiel; John G. Rickenbrode

(57) ABSTRACT

Methods and systems for parsing and decoding compressed data are provided. Random segments of the compressed data may be decompressed and positioned appropriately in the corresponding uncompressed data set. The methods and systems utilize variable to fixed length (VF) coding techniques. For some applications, the VF coding techniques may be implemented within media encoders, decoders, or combined encoder-decoders (CODECs).

25 Claims, 10 Drawing Sheets

FAST PARSING OF VARIABLE-TO-FIXED-LENGTH CODES

This application claims the benefit of U.S. Provisional Application No. 61/121,147, filed Dec. 9, 2008, the entire content of each of which is incorporated herein by reference.

TECHNICAL FIELD

This disclosure relates to fast parsing of data and, more particularly, parsing of data compressed using variable-to-fixed-length codes.

BACKGROUND

Data compression is widely used in a variety of applications to reduce consumption of data storage space, transmission bandwidth, or both. Example applications of data compression include digital video, image, speech and audio coding. Digital video coding, for example, is used in wide range of devices, including digital televisions, digital direct broadcast systems, wireless communication devices, personal digital assistants (PDAs), laptop or desktop computers, digital cameras, digital recording devices, video gaming devices, cellular or satellite radio telephones, or the like. Digital video devices implement video compression techniques, such as MPEG-2, MPEG-4, or H.264/MPEG-4 Advanced Video Coding (AVC), to transmit and receive digital video more efficiently.

In general, video compression techniques perform spatial prediction, motion estimation and motion compensation to reduce or remove redundancy inherent in video data. In particular, intra-coding relies on spatial prediction to reduce or remove spatial redundancy in video within a given video frame. Inter-coding relies on temporal prediction to reduce or remove temporal redundancy in video within adjacent frames. For inter-coding, a video encoder performs motion estimation to track the movement of matching video blocks between two or more adjacent frames. Motion estimation generates motion vectors, which indicate the displacement of video blocks relative to corresponding video blocks in one or more reference frames. Motion compensation uses the motion vector to generate a prediction video block from a reference frame. After motion compensation, a residual video block is formed by subtracting the prediction video block from the original video block.

A video encoder applies transform, quantization and lossless source coding processes (i.e. entropy coding) to further reduce the bit rate of the residual block produced by the video coding process. Lossless coding techniques are used in the final stages of video encoders, and in various other coding applications, prior to storage or transmission of the encoded data. Lossless source coding generally involves the application of arithmetic codes or variable length codes (VLCs) to further compress residual coefficients produced by the transform and quantization operations. Examples of lossless coding techniques include context-adaptive binary arithmetic coding (CABAC) and context-adaptive variable length coding (CAVLC), which may be used as alternative lossless coding modes in some encoders. Other possible lossless coding techniques include variable-to-fixed length codes, sometimes referred to as VF codes. Examples of well-known VF codes include Tunstall codes and Khodak codes. A video decoder performs lossless decoding to decompress residual information for each of the blocks, and reconstructs the encoded video using motion information and the residual information.

SUMMARY

In general, this disclosure is directed to techniques for fast parsing of VF codes for a variety of applications, such as data compression. For example, such techniques may be applied to decode random segments of a set of compressed data. The term coding, as used herein, may generally refer to encoding, decoding, or both. The techniques described in this disclosure may utilize algebraic properties of VF coding trees constructed using Tunstall or Khodak algorithms, and employ combinatorial enumeration techniques for construction, encoding, and decoding of codewords. For some applications, the VF coding techniques may be implemented within media encoders, decoders, or combined encoder-decoders (CODECs). Also, in some aspects, various attributes defining a VF coding tree constructed according to this disclosure may be provided in a memory efficient data structure stored in memory associated with a coding device.

DETAILED DESCRIPTION

In general, this disclosure is directed to techniques for fast parsing of variable to fixed length (VF) codes for a variety of applications, such as coding of digital video, image, audio, or speech data. The term "coding," as used herein, may refer to encoding, decoding or both. Although the techniques described in this disclosure may be applicable to a wide variety of practical applications, including general data compression and coding, the disclosure will refer to digital video encoding and decoding for purposes of example and illustration.

The process of coding using VF codes involves encoding words of variable length into fixed length codes. These fixed length codes may be stored or transmitted to another device. The fixed length codes can then be decoded back to the variable length codes. Such techniques may be useful as forms of data compression. For example, the uncompressed bit string 111011000011 may be representative of one or more data structures (e.g., an array). The bit string may be represented by a sequence of shorter bit strings, referred to as words {11, 101, 1000, 011}. Each of these words can be encoded to a corresponding fixed length code, using a VF code. For example, if codes are assigned for words: {11->0, 101->1, 1000->2, 011->3}, then the example sequence can be encoded as: 0, 1, 2, 3, where each codeword is a 2-bit code.

Figure 4:
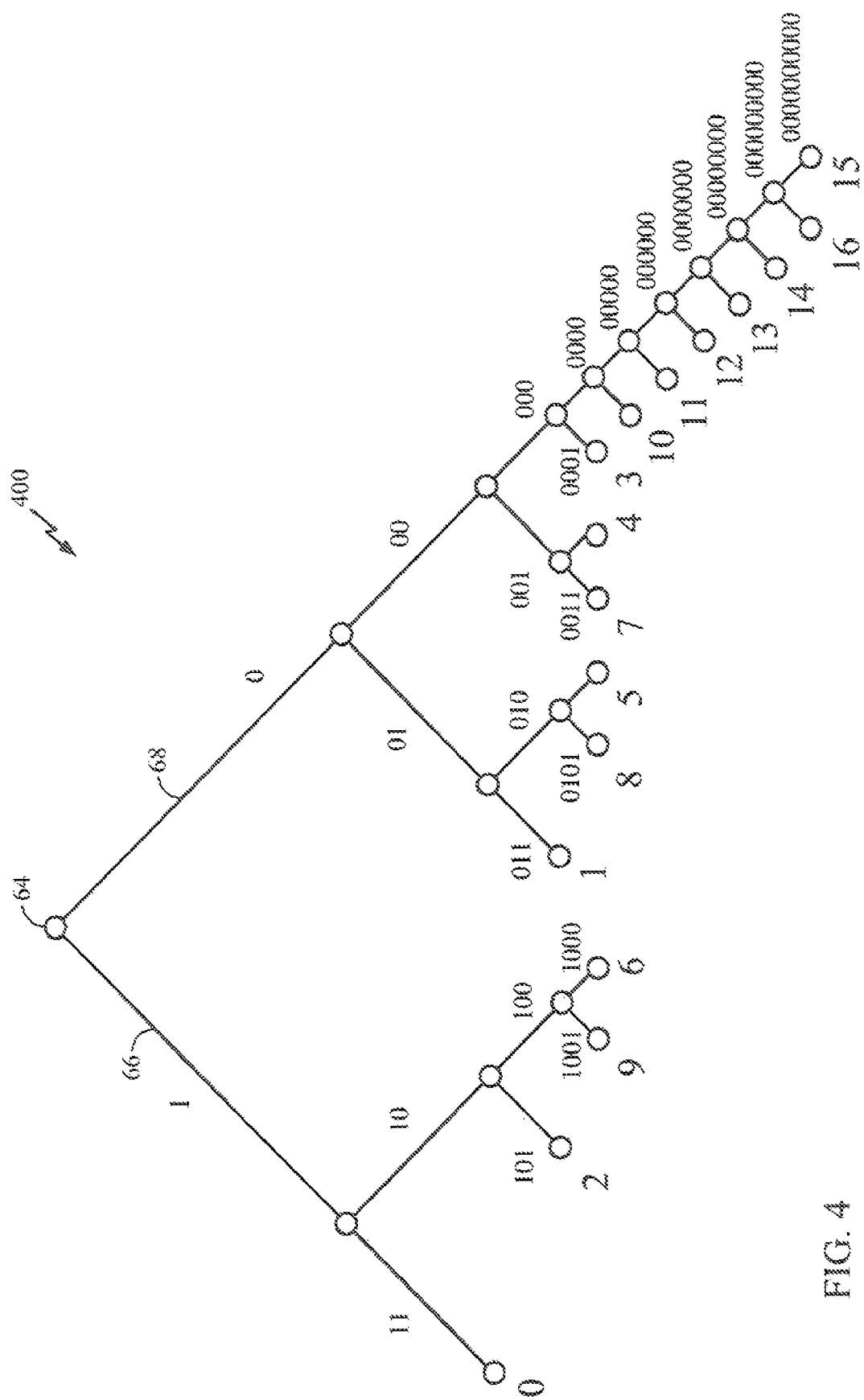
FIG. 4 is a diagram illustrating an example of a VF coding tree.

A VF code can be represented by a VF code tree. FIG. 4 is an example of a binary VF code tree 400. A VF code may comprise a pairing between a plurality of words and a plurality of fixed length codes. Each of the leaf nodes in the VF code tree 400 represents a word in the VF code. Internal nodes are not represented in the VF code. The tree is constructed starting at root node 64. Moving down a link to the right represents a bit value of 0. Moving down a link to the left represents a bit value of 1. Therefore, word 11 is represented by starting at root node 64 and moving down two links to the left.

Each of the leaf nodes of tree 400 are labeled with a number 0-16. The labeled number corresponds to the fixed length code associated with the word that the leaf node represents. By definition, fixed length codes are represented by code values of the same length. In some embodiments the numbers of the fixed length code are binary strings. In order to represent the numbers 0-16 in binary, each of the fixed length codes is represented by 5 bits.

Therefore, according to the VF code tree 400, word 11 is represented by the fixed length code 00000. Words {101, 1000, 011} are represented by the fixed length codes {00010, 00110, 00001}, respectively. Therefore, the uncompressed bit string 111011000011 may be encoded by the VF code of tree 400 to the compressed bit string 00000000100011000001. Use of a fixed length code allows for arbitrary decoding of any of the fixed length codes in the compressed bit string. Since the length of each fixed length code is known, which in this example is 5-bits, a new fixed length code starts every 5-bits. Therefore, in the compressed bit string, the fixed length codes start at positions 0, 5, 10, and 15. Therefore, the fixed length code 00010 starting at position 5 of the compressed bit string, can be immediately decoded to the corresponding word 101, without decoding the remaining fixed length codes in the compressed bit string.

However, though decoding of fixed length code 00010 in compressed bit string 00000000100011000001 produces the word 101, it does not determine where the decoded word should be placed in an uncompressed bit sting. For example, the original uncompressed bit string 111011000011 may correspond to the contents of a memory array. The array in this example is therefore 12 bits long. The array may be encoded to the compressed bit string as detailed above. Decoding the compressed bit string should then result in reproduction of the same 12-bit array with the bits in the correct position in the array. The parsing techniques described herein, provide a quick method of determining the position of the decoded word in the uncompressed bit string.

Parsing techniques as described herein are based on the concept that to determine the position of a word resulting from an arbitrarily decoded fixed length code, it is only necessary to know the length of each of the words associating with the fixed length codes that come before the decoded fixed length code. For instance, in the above example, one fixed length code (00000) is positioned before the selected fixed length code (00010) in the compressed bit stream. To position word 101 corresponding to the selected fixed length code 00010, it is only necessary to know that the length of the word (11) associated with fixed length code 00000 is 2. Accordingly, it is known that word 101 starts at position 2 in the uncompressed bit string, where the first position is position 0.

Storing the length of each word associated with each fixed length code would require large memory storage. The techniques described herein, however, require the length be known for only a subset of the fixed length codes. Each of the fixed length codes within this subset is referred to as a base codeword.

The selection of base codewords is based on properties of VF code trees such as tree 400. The length of each word in the tree is equal to the level the word is found at on the tree. For example, word 11 is found at level 2 of the tree and 1001 is found at level 4 of the tree. Therefore, by determining the level that a fixed length code is associated with on the VF code tree, the length of the word associated with the fixed length code is ascertainable.

The fixed length codes associated with the words are allocated in lexicographical order. Accordingly, the fixed length codes associated with a given leaf node at a particular level, is greater in value than the fixed length codes on any lower level. For example, fixed length code 6 is at level 4. Therefore, by the properties of the tree, fixed length code 6 is greater than any codes on levels 3, 2, or 1. Further, fixed length code 6 is less than any code on a higher level. Utilizing the above properties, the length of the word associated with any fixed length code can be obtained using a list of the smallest lexicographically ordered fixed length code at each level of the tree. In tree 400, the smallest lexicographically ordered fixed length code is associated with the right-most leaf node at each level of the tree that includes at least one leaf node.

For example, in the tree of FIG. 4, the list of the smallest lexicographically ordered fixed length codes for each level of the tree is {0, 1, 3, 10, 11, 12, 13, 14, 15}. Each of these fixed length codes is a base codeword. The length of the word associated with each base codeword can be stored with the base codeword. Therefore, the length of the words associated with all the base codewords can be directly mapped using the list. Further, using the above discussed properties, the length of the word associated with any fixed length code can be determined. The largest base codeword that is less than or equal to the selected fixed length code is on the same level of the VF code tree as the selected fixed length code. Therefore, the length of the word associated with the selected fixed length code is equal to the length stored along with the greatest base codeword that is less than or equal to the selected fixed length code. For example, the greatest base codeword less than or equal to fixed length code 6, is base codeword 3. Base codeword 3 is on level 4 of tree 400 and therefore has an associated word length of 4. Accordingly, fixed length code 6 has an associated word length of 4. Therefore, by storing a simple list of base codewords and performing a simple search, the associated word length of any fixed length code can be determined.

The above is just one example of an embodiment of VF coding and parsing techniques. This embodiment and other embodiments are described with more detail below.

In accordance with some aspects of this disclosure, VF coding techniques may support encoding and decoding of VF codes with a reduced amount of memory space. For example, such techniques may require at most a quadratic amount of space, $O(L^2)$, in Bachmann's O notation, where L is the depth of a VF coding tree. Utilization of a quadratic amount of space $O(L^2)$ may present a substantial improvement over exponential usage of space, $O(2^L)$, by other techniques that make use of complete representations of coding trees in a computer memory.

A reduction in memory space may be achieved, in accordance with an aspect of this disclosure, by utilizing algebraic properties of VF coding trees constructed using Tunstall or Khodak algorithms, and employing combinatorial enumeration for encoding and decoding of codewords. The encoding/ decoding complexity of the techniques described in this disclosure may be linear with the number of symbols processed by such techniques. Reduced memory requirements may enable the use of larger VF coding trees, which in turn, may lead to enhanced efficiency (i.e., lower redundancy) of the encoding.

In accordance with some other aspects of this disclosure, VF coding techniques may support fast decoding of randomly selected codewords in a compressed bitstream using fast parsing techniques. For example, such techniques may require at most an O(log(D)) number of operations for determining the position of a phrase represented by the codeword in an uncompressed bitstream, where the compressed bitstream is an encoded representation of the uncompressed bitstream, and where D is the average decoded phrase length. Other techniques that make use of full decoding of codes to determine position are of O(D) complexity.

Various aspects of this disclosure will be described in greater detail. Set forth below is a description of exemplary video coding systems suitable for use with the VF coding techniques and VF code structures described in this disclosure. Such coding systems and techniques may be useful for coding, including encoding, decoding or both.

Figure 1:
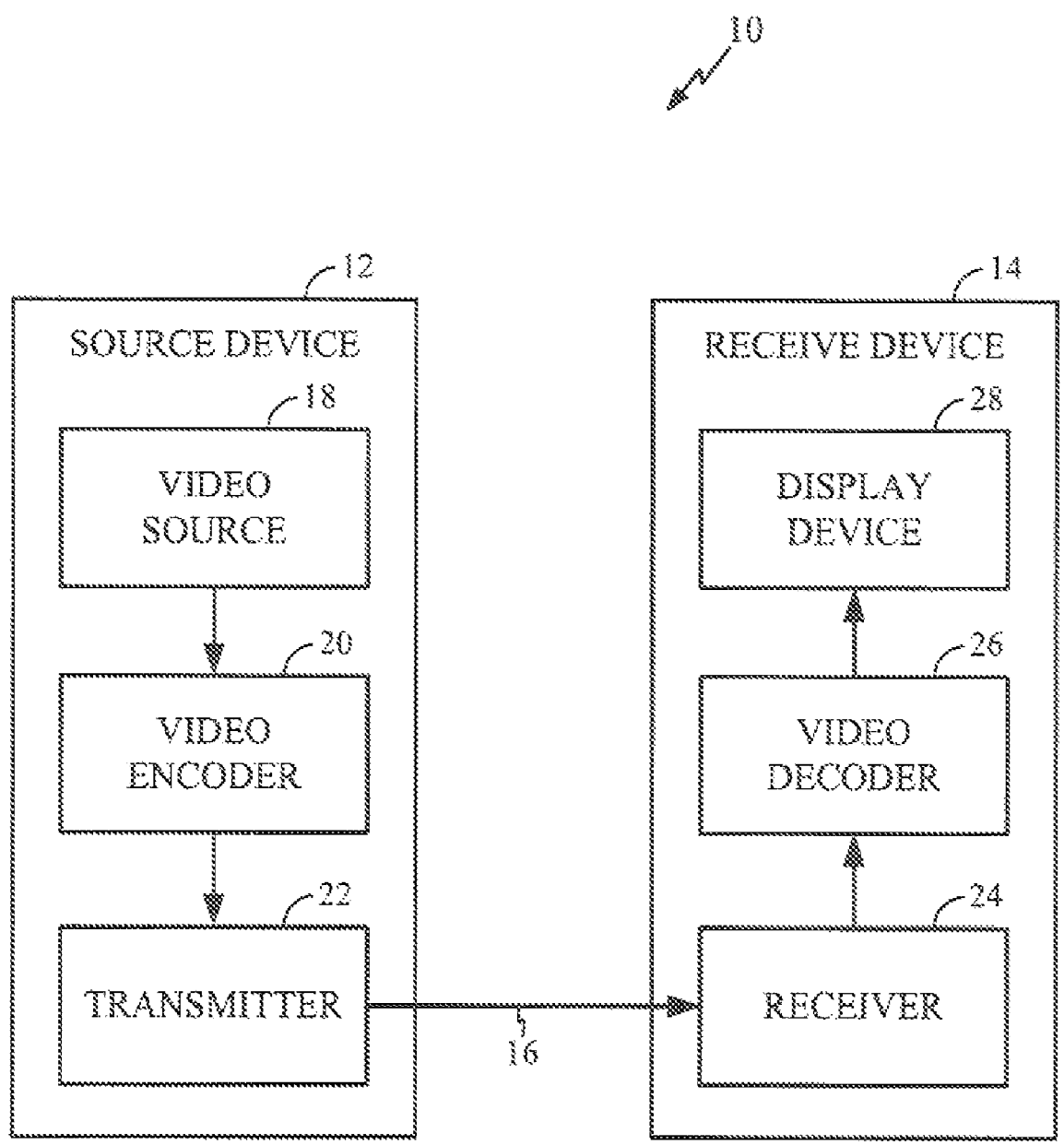
FIG. 1 is a block diagram illustrating a video encoding and decoding system.

FIG. 1 is a block diagram illustrating a video encoding and decoding system 10. As shown in FIG. 1, system 10 includes a source device 12 that transmits encoded video to a receive device 14 via a communication channel 16. Source device 12 may include a video source 18, video encoder 20 and a transmitter 22. Receive device 14 may include a receiver 24, video decoder 26 and video display device 28. System 10 may be configured to apply techniques for memory efficient VF coding of digital video data in accordance with this disclosure. For example, memory efficient VF coding techniques may be used for lossless coding of residual block coefficients produced by a predictive video coding process. As an illustration, the techniques may be applied to video coding schemes that code the positions of nonzero transform coefficients using runs of zeros, or to other video coding schemes.

In the example of FIG. 1, communication channel 16 may comprise any wireless or wired communication medium, such as a radio frequency (RF) spectrum or one or more physical transmission lines, or any combination of wireless and wired media. Channel 16 may form part of a packet-based network, such as a local area network, wide-area network, or a global network such as the Internet. Communication channel 16 generally represents any suitable communication medium, or collection of different communication media, for transmitting video data from source device 12 to receive device 14.

Source device 12 generates video for transmission to destination device 14. In some cases, however, devices 12, 14 may operate in a substantially symmetrical manner. For example, each of devices 12, 14 may include video encoding and decoding components. Hence, system 10 may support one-way or two-way video transmission between video devices 12, 14, e.g., for video streaming, video broadcasting, or video telephony. For other data compression and coding applications, devices 12, 14 could be configured to send and receive, or exchange, other types of data, such as image, speech or audio data, or combinations of two or more of video, image, speech and audio data. Accordingly, discussion of video encoding and decoding applications is provided for purposes of illustration and should not be considered limiting of the various aspects of the disclosure as broadly described herein.

Video source 18 may include a video capture device, such as one or more video cameras, a video archive containing previously captured video, or a live video feed from a video content provider. As a further alternative, video source 18 may generate computer graphics-based data as the source video, or a combination of live video and computer-generated video. In some cases, if video source 18 is a camera, source device 12 and receive device 14 may form so-called camera phones or video phones. Hence, in some aspects, source device 12, receive device 14 or both may form a wireless communication device handset, such as a mobile telephone handset. In each case, the captured, pre-captured or computer-generated video may be encoded by video encoder 20 for transmission from video source device 12 to video decoder 26 of video receive device 14 via transmitter 22, channel 16 and receiver 24. Display device 28 may include any of a variety of display devices such as a liquid crystal display (LCD), plasma display or organic light emitting diode (OLED) display.

Video encoder 20 and video decoder 26 may be configured to support scalable video coding (SVC) for spatial, temporal and/or signal-to-noise ratio (SNR) scalability. In some aspects, video encoder 20 and video decoder 22 may be configured to support fine granularity SNR scalability (FGS) coding for SVC. Encoder 20 and decoder 26 may support various degrees of scalability by supporting encoding, transmission and decoding of a base layer and one or more scalable enhancement layers. For scalable video coding, a base layer carries video data with a minimum level of quality. One or more enhancement layers carry additional bitstream to support higher spatial, temporal and/or SNR levels.

Video encoder 20 and video decoder 26 may operate according to a video compression standard, such as MPEG-2, MPEG-4, ITU-T H.263, or ITU-T H.264/MPEG-4 Advanced Video Coding (AVC). Although not shown in FIG. 1, in some aspects, video encoder 20 and video decoder 26 may be integrated with an audio encoder and decoder, respectively, and include appropriate MUX-DEMUX units, or other hardware and software, to handle encoding of both audio and video in a common data stream or separate data streams. If applicable, MUX-DEMUX units may conform to the ITU H.223 multiplexer protocol, or other protocols such as the user datagram protocol (UDP).

The H.264/MPEG-4 (AVC) standard was formulated by the ITU-T Video Coding Experts Group (VCEG) together with the ISO/IEC Moving Picture Experts Group (MPEG) as the product of a collective partnership known as the Joint Video Team (JVT). The H.264 standard is described in ITU-T Recommendation H.264, Advanced video coding for generic audiovisual services, by the ITU-T Study Group, and dated March 2005, which may be referred to herein as the H.264 standard or H.264 specification, or the H.264/AVC standard or specification.

In some aspects, for video broadcasting, the techniques described in this disclosure may be applied to Enhanced H.264 video coding for delivering real-time video services in terrestrial mobile multimedia multicast (TM3) systems using the Forward Link Only (FLO) Air Interface Specification, "Forward Link Only Air Interface Specification for Terrestrial Mobile Multimedia Multicast," to be published as Technical Standard TIA-1099 (the "FLO Specification"), e.g., via a wireless video broadcast server or wireless communication device handset. The FLO Specification includes examples defining bitstream syntax and semantics and decoding processes suitable for the FLO Air Interface. Alternatively, video may be broadcasted according to other standards such as DVB-H (digital video broadcast-handheld), ISDB-T (integrated services digital broadcast-terrestrial), or DMB (digital media broadcast). Hence, source device 12 may be a mobile wireless terminal, a video streaming server, or a video broadcast server. However, techniques described in this disclosure are not limited to any particular type of broadcast, multicast, or point-to-point system. In the case of broadcast, source device 12 may broadcast several channels of video data to multiple receive device, each of which may be similar to receive device 14 of FIG. 1.

Video encoder 20 and video decoder 26 each may be implemented as one or more microprocessors, digital signal processors (DSPs), application specific integrated circuits (ASICs), field programmable gate arrays (FPGAs), discrete logic, software, hardware, firmware or any combinations thereof. Hence, each of video encoder 20 and video decoder 26 may be implemented at least partially as an integrated circuit (IC) chip or device, and included in one or more encoders or decoders, either of which may be integrated as part of a combined encoder/decoder (CODEC) in a respective mobile device, subscriber device, broadcast device, server, or the like. In addition, source device 12 and receive device 14 each may include appropriate modulation, demodulation, frequency conversion, filtering, and amplifier components for transmission and reception of encoded video, as applicable, including radio frequency (RF) wireless components and antennas sufficient to support wireless communication. For ease of illustration, however, such components are not shown in FIG. 1.

A video sequence includes a series of video frames. Video encoder 20 operates on blocks of pixels within individual video frames in order to encode the video data. The video blocks may have fixed or varying sizes, and may differ in size according to a specified coding standard. Each video frame includes a series of slices. Each slice may include a series of macroblocks, which may be arranged into sub-blocks. As an example, the ITU-T H.264 standard supports intra prediction in various block sizes, such as 16 by 16, 8 by 8, 4 by 4 for luma components, and 8×8 for chroma components, as well as inter prediction in various block sizes, such as 16 by 16, 16 by 8, 8 by 16, 8 by 8, 8 by 4, 4 by 8 and 4 by 4 for luma components and corresponding scaled sizes for chroma components.

Smaller video blocks can provide better resolution, and may be used for locations of a video frame that include higher levels of detail. In general, macroblocks (MBs) and the various sub-blocks may be considered to be video blocks. In addition, a slice may be considered to be a series of video blocks, such as MBs and/or sub-blocks. Each slice may be an independently decodable unit. After prediction, a transform may be performed on the 8×8 residual block or 4×4 residual block, and an additional transform may be applied to the DC coefficients of the 4×4 blocks for chroma components or luma component if the intra_16×16 prediction mode is used.

Video encoder 20 and/or video decoder 26 of system 10 of FIG. 1 may be configured to employ techniques for memory efficient VF coding techniques and fast parsing of VF codes as described in this disclosure. In particular, video encoder 20 and/or video decoder 26 may include an entropy encoder and entropy decoder, respectively, that apply at least some of such techniques to reduce memory utilization, processing overhead, processing complexity, bandwidth consumption, data storage space, and/or power consumption.

Figure 2:
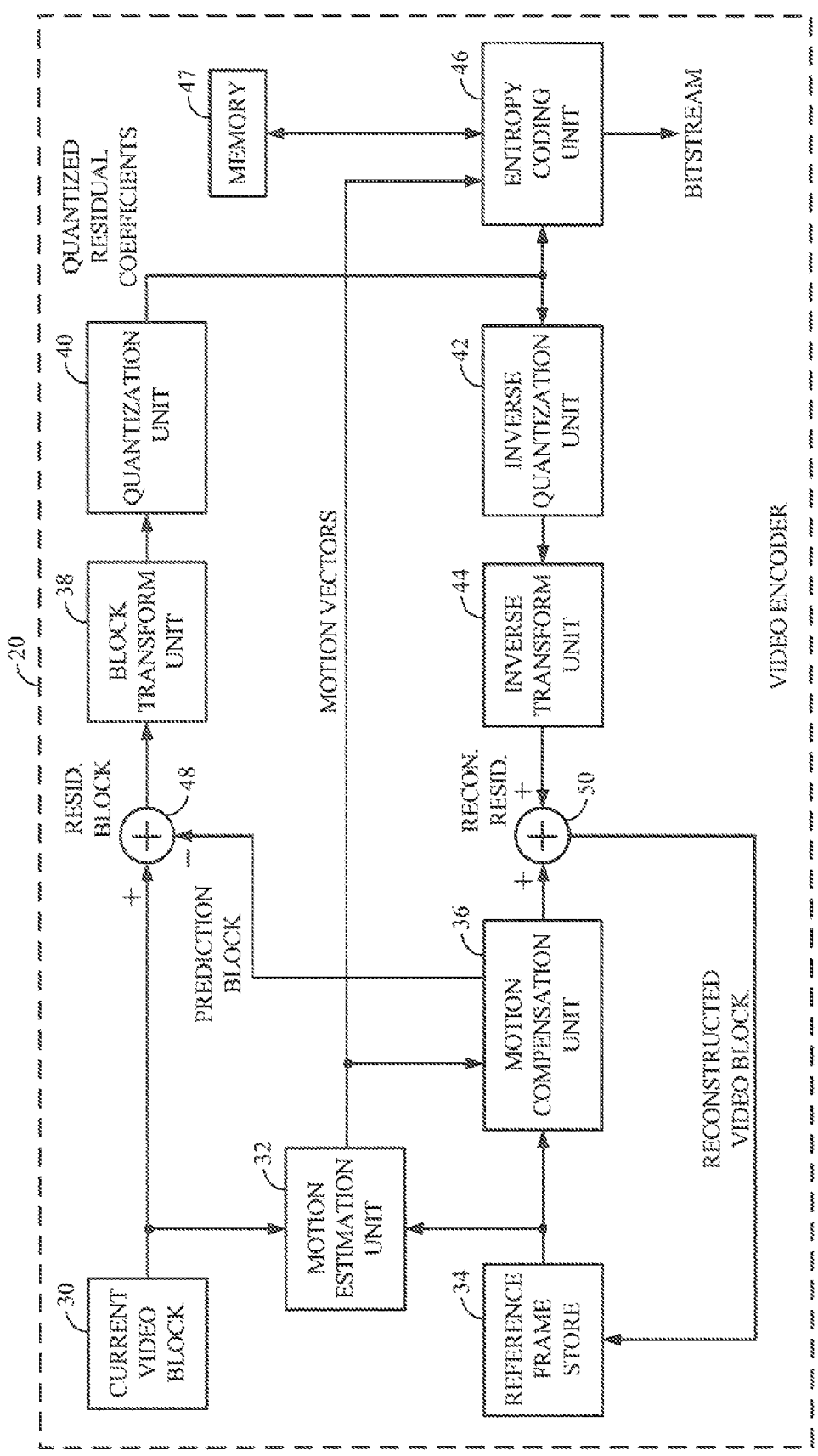
FIG. 2 is a block diagram illustrating an example of a video encoder.

FIG. 2 is a block diagram illustrating an example of a video encoder 20 as shown in FIG. 1. Video encoder 20 may be formed at least in part as one or more integrated circuit devices, which may be referred to collectively as an integrated circuit device. In some aspects, video encoder 20 may form part of a wireless communication device handset or broadcast server. Video encoder 20 may perform intra- and inter-coding of blocks within video frames. Intra-coding relies on spatial prediction to reduce or remove spatial redundancy in video within a given video frame. Inter-coding relies on temporal prediction to reduce or remove temporal redundancy in video within adjacent frames of a video sequence. For inter-coding, video encoder 20 performs motion estimation to track the movement of matching video blocks between adjacent frames.

As shown in FIG. 2, video encoder 20 receives a current video block 30 within a video frame to be encoded. In the example of FIG. 2, video encoder 20 includes motion estimation unit 32, reference frame store 34, motion compensation unit 36, block transform unit 38, quantization unit 40, inverse quantization unit 42, inverse transform unit 44 and entropy encoding unit 46. Video encoder 20 also may include memory including memory 47, which may be used by entropy encoding unit 46 for storage and retrieval of coding data including contents of one or more data structures including attributes defining the arrangement of a VF code structure represented by a VF coding tree for use in VF coding, including encoding or decoding, in accordance with various aspects of this disclosure. An in-loop deblocking filter (not shown) may be applied to filter blocks to remove blocking artifacts. Video encoder 20 also includes summer 48 and summer 50. FIG. 2 illustrates the temporal prediction components of video encoder 20 for inter-coding of video blocks. Although not shown in FIG. 2 for ease of illustration, video encoder 20 also may include spatial prediction components for intra-coding of some video blocks.

Motion estimation unit 32 compares video block 30 to blocks in one or more adjacent video frames to generate one or more motion vectors. The adjacent frame or frames may be retrieved from reference frame store 34, which may comprise any type of memory or data storage device to store video blocks reconstructed from previously encoded blocks. Motion estimation may be performed for blocks of variable sizes, e.g., 16×16, 16×8, 8×16, 8×8 or smaller block sizes.

In operation, motion estimation unit 32 identifies one or more blocks in adjacent frames that most closely match the current video block 30, e.g., based on a rate distortion model, and determines displacement between the blocks in adjacent frames and the current video block. On this basis, motion estimation unit 32 produces one or more motion vectors (MV) that indicate the magnitude and trajectory of the displacement between current video block 30 and one or more matching blocks from the reference frames used to code current video block 30.

Motion vectors may have half- or quarter-pixel precision, or even finer precision, allowing video encoder 20 to track motion with higher precision than integer pixel locations and obtain a better prediction block. When motion vectors with fractional pixel values are used, interpolation operations are carried out in motion compensation unit 36. Motion estimation unit 32 identifies the best block partitions and motion vector or motion vectors for a video block using certain criteria, such as a rate-distortion model. For example, there may be more than motion vector in the case of bi-directional prediction. Using the resulting block partitions and motion vectors, motion compensation unit 36 forms a prediction video block.

Video encoder 20 forms a residual video block by subtracting the prediction video block produced by motion compensation unit 36 from the original, current video block 30 at summer 48. Block transform unit 38 applies a transform, such as the 4×4 or 8×8 integer transform used in H.264/AVC, to the residual block, producing residual transform block coefficients. Quantization unit 40 quantizes the residual transform block coefficients to further reduce bit rate. Lossless encoding unit 46 entropy codes the quantized coefficients to even further reduce bit rate.

Lossless encoding unit 46 operates as a VF encoding unit to apply VF encoding to the quantized block coefficients. In particular, entropy encoding unit 46 may be configured to perform VF encoding of digital video block coefficients using memory efficient VF encoding techniques as described in this disclosure. Hence, the various VF encoding processes described in this disclosure may be implemented within lossless encoding unit 46 to perform encoding of video data. Alternatively, such a lossless encoding unit 46 may perform the processes described in this disclosure to encode any of a variety of data, including but not limited to video, image, speech and audio data. In general, video decoder 26 performs inverse operations, including VF decoding and parsing, to decode and reconstruct the encoded video, as will be described, e.g., with reference to FIG. 3.

Inverse quantization unit 42 and inverse transform unit 44 apply inverse quantization and inverse transformation, respectively, to reconstruct the residual block. Adder 50 adds the reconstructed residual block to the motion compensated prediction block produced by motion compensation unit 36 to produce a reconstructed video block for storage in reference frame store 34. The reconstructed video block is used by motion estimation unit 32 and motion compensation unit 36 to encode a block in a subsequent video frame.

Figure 3:
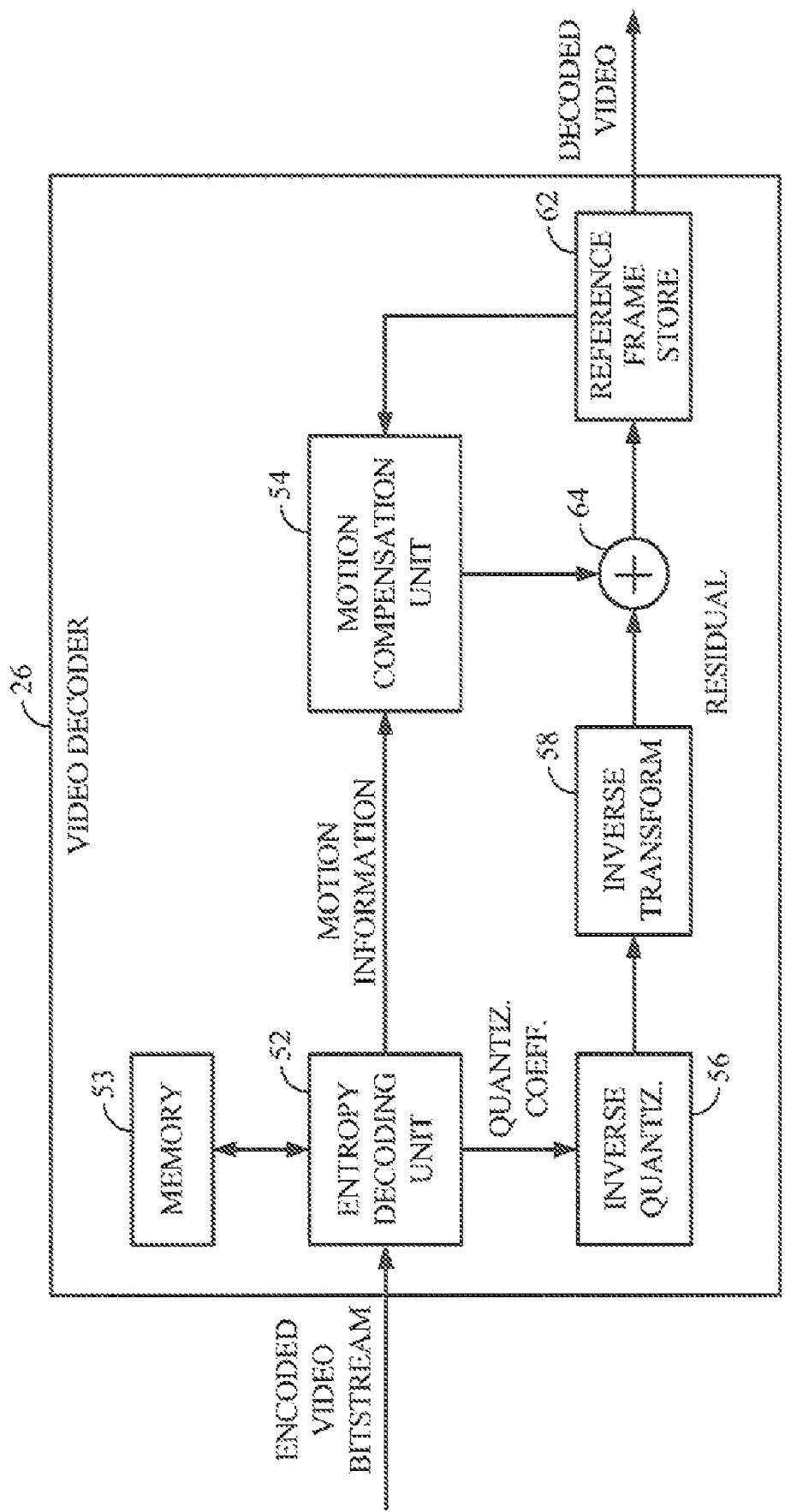
FIG. 3 is a block diagram illustrating an example of a video decoder.

FIG. 3 is a block diagram illustrating an example of a video decoder 26. Video decoder 26 may be formed at least in part as one or more integrated circuit devices, which may be referred to collectively as an integrated circuit device. In some aspects, video decoder 26 may form part of a wireless communication device handset. Video decoder 26 may perform intra- and inter-decoding of blocks within video frames. As shown in FIG. 3, video decoder 26 receives an encoded video bitstream from a receiver 24 (FIG. 1) that has been encoded by video encoder 20. In the example of FIG. 3, video decoder 26 includes entropy decoding unit 52, motion compensation unit 54, inverse quantization unit 56, inverse transform unit 58, and reference frame store 62. Video decoder 26 also may include memory, including memory 53, which may be used by entropy decoding unit 52 for storage and retrieval of coding data including contents of one or more data structures including attributes defining the arrangement of a VF coding tree for use in VF decoding. Video decoder 26 also may include an in-loop deblocking filter (not shown) that filters the output of summer 64. Video decoder 26 also includes summer 64. FIG. 3 illustrates the temporal prediction components of video decoder 26 for inter-decoding of video blocks. Although not shown in FIG. 3, video decoder 26 also may include spatial prediction components for intra-decoding of some video blocks.

Lossless decoding unit 52 receives the encoded video bitstream and decodes from the bitstream quantized residual coefficients, macroblock coding mode and motion information, which may include motion vectors and block partitions. Hence, entropy decoding unit 52 functions as a VF decoding unit, and may rely on a data structure stored in memory 53 to define various attributes of a VF coding tree. For example, in order to decode quantized residual coefficients from the encoded bitstream, like lossless encoding unit 46 of FIG. 2, entropy decoding unit 52 of FIG. 3 may perform memory efficient VF decoding of digital video block coefficients as described in this disclosure. However, lossless decoding unit 52 may perform VF decoding in an inverse manner relative to lossless encoding unit 46 of FIG. 2 in order to retrieve quantized block coefficients from the encoded bitstream. Lossless decoding unit 52 may also perform VF parsing techniques for fast decoding of randomly selected codewords in the encoded bitstream. The various decoding and parsing processes described in this disclosure may be implemented within entropy decoding unit 52 to perform decoding of video data. Alternatively, such an lossless decoding unit 52 may perform the processes described in this disclosure to decode any of a variety of data, including but not limited to video, image, speech and audio data. In either case, the result of the variable length coding performed by entropy decoding unit 52 may be output to a user, stored in memory and/or transmitted to another device or processing unit.

Motion compensation unit 54 receives the motion vectors and block partitions and one or more reconstructed reference frames from reference frame store 62 to produce a prediction video block. Inverse quantization unit 56 inverse quantizes, i.e., de-quantizes, the quantized block coefficients. Inverse transform unit 58 applies an inverse transform, e.g., an inverse DCT or an inverse 4×4 or 8×8 integer transform, to the coefficients to produce residual blocks. The prediction video blocks are then summed by summer 64 with the residual blocks to form decoded blocks. A deblocking filter (not shown) may be applied to filter the decoded blocks to remove blocking artifacts. The filtered blocks are then placed in reference frame store 62, which provides reference frame for decoding of subsequent video frames and also produces decoded video to drive display device 28 (FIG. 1).

Examples of memory efficient techniques for VF coding to support various data structures will now be described in greater detail. These coding techniques may be implemented within the encoders and decoders described above. Consider a memoryless source S. Source S produces symbols from an input alphabet $A=\{a_1, \ldots, a_m\}$ ($2 \leq m \leq \infty$), wherein the probability of each symbol being produced has a probability $\{p_i=P(a_i), i=1, \ldots, m\}$. The sum of all of the probabilities of each symbol being produced is 1. For example, where m=2, the symbols for $a_1$ and $a_2$, may be 0 and 1, respectively. The probability of 1 (P(1)) may be 0.6, and P(0) would then equal 0.4. The values $p_{min}, p_{max}$ denote the probabilities of the least- and the most-likely symbols correspondingly, with the assumption that $0 < p_{min} \leq p_{max} < 1$.

A message $\Sigma=\{a_{i_k}\}_{k=1}^{\infty}$ is assumed to be an infinite-length sequence of symbols produced by the source S. The main concept of variable length coding is to define a set of words $X=\{x_j \in A^*, j=1, \ldots, M\}$ ($m \leq M < \infty$), such that any message $\Sigma$ can be uniquely represented by a sequence of words from X, and then map words $x_j$ into codewords $\Phi(x_j)$ formed from letters of an output alphabet $B=\{b_1, \ldots, b_n\}$ ($2 \leq n < \infty$): $\{a_{i_k}\}_{k=1}^{\infty} = \{X_{j_r}\}_{r=1}^{\infty} \to \{\phi(X_{j_r})\}_{r=1}^{\infty} = \{b_{i_s}\}_{s=1}^{\infty}$ It is assumed that the mapping $\Phi$ is injective, and that the output code $\{\Phi(x_j)\}$ is uniquely decodable, e.g., as described in T. M. Cover and J. M. Thomas, Elements of Information Theory, (John Wiley & Sons, New York, 1991).

In accordance with this disclosure, VF coding techniques may be applied to coding systems producing codewords $\Phi(x_j)$ with the same length. For example, it is possible to simply select $|\Phi(x_j)|=\lceil \log_n M \rceil$ ($1 \leq j \leq M$), and use indices of words $x_j$ to produce codes for such words. Codes produced by such coding systems may be referred to as variable-length-to-block (VB) or variable-to-fixed-length (VF) codes. In general, the term VF code will be used in this disclosure.

The problem of construction of a VF code for a given source S involves finding a prefix-free set X of constrained size $|X| \leq M$, such that the average redundancy of encoding of the following source:

$$R_{VF}(X, S) = \frac{\lceil \log M \rceil}{d(X, S)} - h(S) \quad (1)$$

is minimal. In this case, d(X, S) denotes the average delay (or average length of a word in X):

$$d(X, S) = \sum_{j=1}^{M} P(x_j)|x_j|, \quad (2)$$

and h(S) is the entropy of the source:

$$h(S) = -\sum_{i=1}^{m} p_i \log p_i, \quad (3)$$

In some cases, it may be sufficient to find a prefix set X minimizing the idealized average redundancy:

$$R^*_{VF}(X, S) = \frac{\log M}{d(X, S)} - h(S), \quad (4)$$

The above problems are similar.

The best known algorithm for construction of optimal VF-codes for memoryless sources was described by B. P. Tunstall, in B. P. Tunstall, Synthesis of Noiseless Compression Codes, Ph.D. dissertation, (Georgia Inst. Tech., Atlanta, Ga., 1968). Tunstall coding is also described and analyzed in F. Jelinek, and K. S. Schneider, On Variable-Length-to-Block Coding, IEEE Trans. Inf. Theory, 18 (6) (1972) 765-774. The Tunstall coding process starts with tree $\Delta^{(1)}$ consisting of a single node connected to m leaves, corresponding to letters of input alphabet A. For example, node 64 of FIG. 4 would be a single starting node. FIG. 4 is a binary tree, so therefore, m=2, and thus in the first step, node 64 is connected to two leaves via links 66 and 68. Then, the coding process picks a leaf corresponding to a letter with highest probability and replaces it with a node connected to new leaves. This process is repeated successively, picking at each step a leaf corresponding to a word with highest probability. It can be seen that, after i steps, this coding process produces a tree $\Delta^{(i)}$ with (m−1)i+1 leaves. This tree corresponds to a prefix-free set of words $X(\Delta^{(i)})$, which can be easily enumerated and mapped into $\lceil \log((m-1)i+1) \rceil$-digit codes.

FIG. 4 is a diagram illustrating an example of a VF coding tree. The VF coding tree of FIG. 4 is an example of a coding tree produced by the Tunstall algorithm for a binary memoryless source with a probability Pr(1)=0.2 after sixteen iterations. Table 1 below shows the codes, words and probability (Pr) values for the nodes in the tree of FIG. 4.

TABLE 1

| Code | Word | Pr |
|---|---|---|
| 0 | 11 | 0.04 |
| 1 | 011 | 0.032 |
| 2 | 101 | 0.032 |
| 3 | 0001 | 0.1024 |
| 4 | 0010 | 0.1024 |
| 5 | 0100 | 0.1024 |
| 6 | 1000 | 0.1024 |
| 7 | 0011 | 0.0256 |
| 8 | 0101 | 0.0256 |
| 9 | 1001 | 0.0256 |
| 10 | 00001 | 0.08192 |
| 11 | 000001 | 0.065536 |
| 12 | 0000001 | 0.0524288 |
| 13 | 00000001 | 0.041943 |
| 14 | 000000001 | 0.0335544 |
| 15 | 0000000000 | 0.107374 |
| 16 | 0000000001 | 0.0268435 |

As shown in FIG. 4, the coding process extends outward from a root node 64 and along left and right branches 66, 68, respectively. The coding process traces the branches of the tree to assign a fixed length code to each of the variable length words in Table 1. Nodes 0 through 16 in the tree of FIG. 4 specify corresponding fixed length codes for respective variable length input words presented in Table 1 above. The words have variable lengths such that some words contain more symbols that other words. The assignment of code numbers in the VF code in FIG. 4. and Table 1 is done in a particular order, which is convenient for explaining exemplary techniques in accordance with this disclosure. In a more general case, however, the assignment of code numbers can be done differently, allowing all possible permutations of code numbers.

The Tunstall coding process has been very well studied and used for a number of applications in coding theory and beyond. Simple bounds for its redundancy have been independently obtained and described in G. L. Khodak, Connection Between Redundancy and Average Delay of Fixed-Length Coding, All-Union Conference on Problems of Theoretical Cybernetics (Novosibirsk, USSR, 1969) 12 (in Russian), and F. Jelinek, and K. S. Schneider, On Variable-Length-to-Block Coding, IEEE Trans. Inf. Theory, 18 (6) (1972) 765-774. Generalizations of Tunstall codes for sources with memory have been proposed by T. J. Tjalkens and F. M. J. Willems, Variable to Fixed-length codes for Markov sources," I.E.E.E. Trans. Inf. Theory IT-33, 246-257, 1987, and S. A. Savari, Robert G. Gallager, Generalized Tunstall codes for sources with memory, IEEE Trans. Info. Theory, vol. IT-43, pp. 658-668, March 1997. More accurate asymptotic analysis of its redundancy (4) has been offered by S. A. Savari, Variable-to-Fixed Length Codes for Predictable Sources, Proc IEEE Data Compression Conference, Snowbird, Utah, Mar. 30-Apr. 1, 1998, pp. 481-490, and by M. Drmota, Y. A. Reznik, S. A. Savari, and W. Szpankowski, Precise Asymptotic Analysis of the Tunstall Code, IEEE International Symposium on Information Theory (ISIT06), Seattle, Wash., Jul. 9-14, 2006. Applications of the Tunstall algorithm for approximation of uniform distributions, random number generation, and related problems have been discussed.

The Tunstall coding process is not the only technique available for construction of variable-to-fixed-length (VF) codes. G. L. Khodak described another code construction technique, in G. L. Khodak, Connection Between Redundancy and Average Delay of Fixed-Length Coding, All-Union Conference on Problems of Theoretical Cybernetics (Novosibirsk, USSR, 1969) 12 (in Russian). The Khodak process is also described in G. L. Khodak, Redundancy Estimates for Word-Based Encoding of Messages Produced by Bernoulli Sources, Probl. Inf. Trans., 8, (2) (1972) 21-32 (in Russian), and R. E. Krichevsky, Universal Data Compression and Retrieval. (Kluwer, 1993). The Khodak process starts with a tree containing a single node, such as node 64 of FIG. 4, and grows it progressively until all its leaves x satisfy:

$$\frac{1}{N} \leq P(x) < \frac{1}{N_{P_{min}}}, \quad (5)$$

where N is a fixed real number ($N>1/p_{min}$). The condition (5) above implies that the total number of leaves in the resulting tree $\Delta_N$ satisfies:

$$|X(\Delta_N)| \leq N. \quad (6)$$

By selecting different values of N, one can control the size of the resulting trees, although with certain granularity because condition (5) applies to all leaves. It can also be shown that a tree $\Delta_N$ constructed using the Khodak technique with parameter N is exactly the same as the tree $\Delta^{(i_N)}$ constructed using the Tunstall technique after $$i_N = \frac{|X(\Delta_N)| - 1}{m - 1}$$

steps. Therefore, tree 400 of FIG. 4 can be constructed using either the Tunstall or Khodak technique.

Hence, both the Tunstall and Khodak techniques can be used to solve the same problem. The Tunstall technique has an advantage of providing explicit control over the number of leaves in the resulting trees. The Khodak scheme, on the other hand, provides simple algebraic characterization of the coding tree, per expression (5), which can be used to perform direct construction of the coding tree. Similar to the Tunstall code, there is flexibility in choosing the order in which code indices are assigned, and one of the aspects of the present disclosure defines a particular order of such assignment.

In accordance with this disclosure, techniques for efficient encoding and/or decoding of VF codes are provided. Such techniques may be applied to video coding, audio coding, voice coding, speech coding or other applications. Utilizing algebraic properties of VF coding trees constructed, e.g., using Tunstall or Khodak algorithms, and rearranging their code indices in a particular order, allowing the use of combinatorial enumeration techniques for encoding and/or decoding of codewords, the techniques may support substantial memory savings. For example, in some aspects, such techniques may require at most a quadratic amount of memory space $O(L^2)$, where L is the depth of the coding tree. In addition, the coding complexity of such techniques may be linear with the number of symbols they process.

Two simple lemmas support direct enumeration of internal codes in VF coding trees in accordance with this disclosure.

According to Lemma 1, probabilities of internal nodes $\omega$ in a tree $\Delta_N$ satisfying Khodak condition (5) above have the following property:

$$P(\omega) \geq \frac{1}{N_{P_{min}}} \quad (7)$$

Proof: It follows directly from condition (5) and the fact that $P(\omega)$ must be greater than the probability of a leaf.

According to Lemma 2, any string $\omega \in A^*$ such that:

$$P(\omega) \geq \frac{1}{N_{P_{min}}} \quad (8)$$

leads to an existing internal node in a tree $\Delta_N$, satisfying Khodak condition (5) above. Proof: If this is not correct, then there must exist a prefix $u:\omega=uv, |u|>0, |v|>0$, leading to an external node. Then, according to condition (5) above, it must be true that $P(u) < 1/N_{P_{min}}$. However, this contradicts equation (8) above and the fact that $P(\omega) = P(u)P(v) < P(u)$.

Tighter bounds for probabilities of leaves in trees constructed using Khodak's algorithm can be derived according to the following lemmas. According to Lemma 3, leaves x attached to $\alpha$-branches ($\alpha \in A$) in a tree $\Delta_N$ satisfying condition (5) above have the following properties:

$$\frac{P(\alpha)}{N_{P_{min}}} \leq P(x) = P(\omega\alpha) < \frac{1}{N_{P_{min}}} \quad (9)$$

Proof: Consider an internal node corresponding to a string w. Its children correspond to single-letter extensions of $\omega: \omega\alpha$, $\alpha \in A$. If a node $\omega\alpha$ becomes an external node, then, according to Khodak condition (5) above, it must satisfy:

$$P(\omega\alpha) = P(\omega)P(\alpha) < \frac{1}{N_{P_{min}}}. \quad (10)$$

Because $\omega$ is internal (cf. Lemma 1):

$$P(\omega) \geq \frac{1}{N_{P_{min}}}. \quad (11)$$

Combining both expressions above produces expression (9).

According to Lemma 4, all strings $\omega \in A^*$ such that:

$$\frac{P(\alpha)}{N_{P_{min}}} \leq P(\omega\alpha) < \frac{1}{N_{P_{min}}} \quad (12)$$

correspond to internal nodes having $\alpha$-branches that are immediately connected to leaves in a tree $\Delta_N$ satisfying Khodak condition (5). Proof: The left side of expression (12) ensures that $\omega$ is a valid internal node in tree $\Delta_N$ (cf. Lemma 2). It also implies that condition (5) is satisfied for $\omega\alpha$, such that it must be a leaf. Although Khodak's condition (5) is formulated as limits on probabilities of leaves, it cannot be used for their direct enumeration. In order to use condition (5), one has to maintain a binary tree structure and grow it progressively until all of its leaves satisfy condition (5). Condition (12) above can be used directly, without building a tree structure.

The structure of an example VF coding tree, in accordance with enumerative coding techniques presented in this disclosure, will now be described. Lemma 4 above implies that all words in a VF-code tree $\Delta_N$ for a memoryless source can be enumerated as follows:

$$X(\Delta_N) = \bigcup_{l,k_1,\ldots,k_m: p_i N^{-1} p_{min}^{-1} \le p_1^{k_1} \ldots p_m^{k_m} p_2 \le N^{-1} p_{min}^{-1}} X_{l,k_1,\ldots,k_m,i} \quad (13)$$

where each group $X_{l,k_1,\ldots,k_m,i}$ contains $$\binom{l}{k_1,\ldots,k_m}$$

words of length l+1, terminating on the i-th symbol and having probabilities $p_1^{k_1} \ldots p_m^{k_m} p_i$, where $k_1, \ldots, k_m, i$ indicate numbers of symbols of each kind in their first l positions.

In a binary case, with Pr(1)=p, Pr(0)=q, p<q, equation (13) can be rewritten as $$X(\Delta_N) = \bigcup_{\substack{l,k,0: qN^{-1}p^{-1} \le p^k q^{l+1-k} < N^{-1} p^{-1} \\ l,k,1: N^{-1} \le p^{k+1} q^{l-k} < N^{-1} p^{-1}}} X_{l,k,a} \quad (14)$$

where groups X.sub.l,k,a are formed by $$\binom{l}{k}$$

words of length l+1, in which the first l bits contain k ones, and the last symbol is a.

In addition to this separation of groups, the techniques described in this disclosure may also specify that all words $$\binom{l}{k_1,\ldots,k_m} \text{ or } \binom{l}{k}$$

in each subgroup are arranged in a lexicographical order or, more generally, any other order that allows fast combinatorial computation of indices of blocks in such subgroups. In this manner, the techniques may produce a particular variant of VF code that permits fast combinatorial computation.

For reasonably short words, e.g., less than or approximately equal to 12, computation of their lexicographic indices (or synthesis of words, using their indices) can be a matter of a single lookup. For longer words, it is possible to use the following well-known combinatorial formula $$\text{index}(l, k, \omega) = \sum_{i=1}^{l} \omega_j \binom{l-j}{\sum_{k=j}^{l} \omega_k},$$

where $\omega_j$ represents individual bits of the word $\omega$, and it is assumed that $$\binom{l}{k} = 0$$

for all k>l. In this manner, the code may support efficient combinatorial enumeration for quick computation of indices of blocks in the subgroups.

Figure 5:
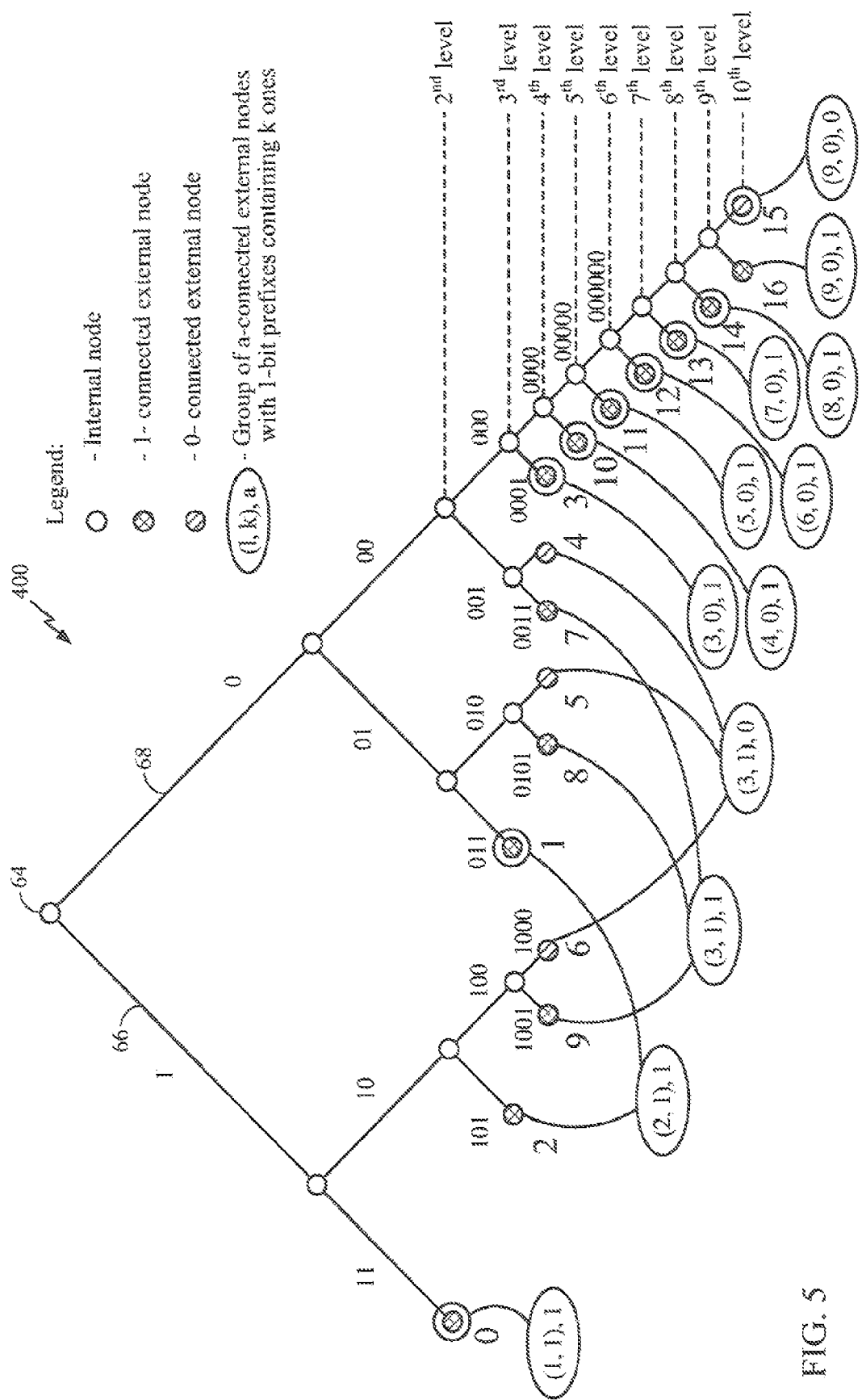
FIG. 5 is a diagram of the VF coding tree of FIG. 4.

FIG. 5 is a diagram of the VF coding tree of FIG. 4 with nodes arranged into groups according to an enumerative VF coding scheme. The VF coding tree represents an exemplary code structure. In particular, FIG. 5 illustrates the structure of a partition as defined by equation (14). The VF code structure in the tree of FIG. 5 is identical to the VF code structure in the example of FIG. 4, but illustrates the enumerative coding scheme in terms of designating lists of groups of codes within the tree. In particular, for each level l of the coding tree, the number of groups $X_{l,k,a}$ belonging to that level is at most 2*(l+1). This number corresponds to a case in which the tree is a complete tree with all leaves located at level l. Hence, the total number of groups contained in L levels of the tree $\Delta_N$ is at most $O(L^2)$, using Bachmann's O notation. This number is significantly less than the total number of nodes or leaves contained in a conventional tree of the same depth, which is typically exponential, i.e., $O(2^L)$.

As shown in the example of FIG. 5, the VF coding tree includes twelve groups $X_{l,k,a}$, which will be identified by reference to the pertinent l, k, and a values, which indicate prefix length, number of ones in the prefix, and the terminating symbol (e.g., 0 or 1 bit), respectively. The value of l also indicates the level within the tree. In the VF coding tree of FIG. 5, there is a single group at level 1. Group (1, 1), 1 includes a single leaf corresponding to code 0 and word 11. In this case, l=1 is the length of the prefix, k=1 is the number of ones in the prefix, and a=1 is the terminating bit. At level 2 of the VF coding tree, there is one group. Group (2, 1), 1 includes two leaves pertaining to code 1 and word 011 and code 2 and word 101. In this case, l=2 is the length of the prefix, k=1 is the number of ones in the prefix, and a=1 is the terminating bit.

At level 3 of the VF coding tree, there are three groups. Group (3, 1), 1 includes three leaves pertaining to code 7 and word 0011, code 8 and word 0101, and code 9 and word 1001. For this group, l=3 is the length of the prefix, k=1 is the number of ones in the prefix, and a=1 is the terminating bit. Group (3, 1), 0 includes three leaves pertaining to code 4 and word 0010, code 5 and word 0100, and code 6 and word 1000. For this group, l=3 is the length of the prefix, k=1 is the number of ones in the prefix, and a=0 is the terminating bit. Group (3, 0), 1 includes a single leaf pertaining to code 3 and word 0001. For this group, l=3 is the length of the prefix, k=0 is the number of ones in the prefix, and a=1 is the terminating bit. The remainder of the tree is identified by additional groups $X_{l,k,a}$ in a similar manner.

The l, k and a values, as well as an offset or "base" value indicating the value of the lexicographically first word associated with a code in each group, support enumerative construction and utilization of codes within the VF coding tree. In addition, the groups may be ordered according to the order of the fixed length codes such that the first group, containing code 0, is group (1, 1), 1, the second group, containing codes 1 and 2, is group (2, 1), 1, the third group, containing code 3, is group (3, 0), 1, the fourth group, containing codes 4, 5 and 6, is group (3, 1), 0, the fifth group, containing codes 7, 8 and 9, is group (3, 1), 1, and so forth. A group index j may be established to readily identify groups within the list of groups for the VF coding tree, given this ordering.

The design of a technique for enumerative construction of VF codes will now be described with further reference to FIG. 5. An example of a compact data structure and C code of a construction procedure for binary memoryless sources is also provided. With reference to FIG. 5, in addition to parameters l, k and a for identification of each group $X_{l,k,a}$, the enumerative construction technique also may store a value offset for each group, representing the value of a first code in a respective group. The first code (designated by offset) in each group may be referred to as an offset or base code. As shown in FIG. 5, each of the base codes is circled. As discussed above, the size of a resulting VF coding tree representation in a computer memory may be at most $O(L^2)$, where L is the height of the tree, i.e., the number of levels l in the tree.

In general, techniques for construction of the VF codes, in some aspects, may comprise generating a set of fixed length codes representing variable length words having a lexicographic order. With reference to Table 1, for example, a set of input words have a lexicographic order from the first word 11 to the last word 0000000001. Codes 0 through 16 are used to encode words 11 through 0000000001, respectively. Construction of VF codes may further comprise arranging the fixed length codes in groups $X_{l,k,a}$, e.g., as described above with respect to the VF coding tree of FIG. 5. Each of the groups includes one or more fixed length codes. The one or more fixed length codes in a given group represent variable length words for which a probability is the same and for which a termination symbol is the same.

With reference to Table 1 and FIG. 5, for example, codes 7, 8 and 9 represent variable length words 0011, 0101 and 1001. Each of words 0011, 0101 and 1001 has a terminating symbol a, e.g., a terminating bit, of 1, as indicated by the underlines. In addition, as shown in Table 1, each of words 0011, 0101 and 1001 has a probability of 0.0256. Hence, codes 7, 8 and 9 are placed within the same group $X_{l,k,a}=X_{3,1,1}$, which may alternatively be designated as group (3, 1), 1. With further reference to Table 1, codes 4, 5 and 6 represent input words (0010, 0100, 1000) that have the same lengths as the words represented by codes 7, 8, and 9. However, the input words represented by codes 4, 5, and 6 have a different terminating bit a (0) and a different probability (0.1024).

Hence, codes 4, 5 and 6 are placed in a different group $X_{l,k,a}=X_{3,1,0}$, which may alternatively be designated as group (3, 1), 0. Code 3 represents an input word (0001) having the same length as the input words represented by the other codes at level 3 of the coding tree. In addition, the probability of input word 0001 represented by code 3 is the same as the probability of the input words represented by codes 4, 5 and 6.

However, code 3 represents a code having a different terminating bit a (1). Therefore, code 3 resides in a different group $X_{l,k,a}=X_{3,0,1}$, which may alternatively be designated as group (3, 0), 1.

The set of variable length words has a lexicographic order, e.g., as indicated in Table 1. In each of the VF groups, the one or more fixed length codes are arranged in the lexicographic order of the variable length words they represent. If a group includes only a single fixed length code, lexicographic order is generally immaterial. If a group includes two or more fixed length codes, however, the fixed length codes in the group are ordered according to the lexicographic order of the variable length input words represented by the fixed length codes. With respect to group (3, 1), 0, for example, code 4 represents word 0010, code 5 represents word 0100, and code 6 represents word 1000. Word 0010 is the first word in the lexicographic order of the input word set, word 0100 is the second word, and word 1000 is the third word. Arrangement of the codes within a group according to the lexicographic order of the words they represent may support direction computation of codes in the group based on the value of the lexicographically first code, which may be referred to interchangeably herein as an offset or base code, and index positions of the other codes within the group.

Consistent with the l, k, a notation above, each of the groups may be represented by a length l of a prefix of each of variable length words represented by the fixed length codes in the group, a number k of ones in the prefix of each of the variable length words represented by the fixed length codes in the group, and a termination symbol a of each of the variable length words represented by the fixed length codes in the group. The termination symbol may be a one-bit value of 0 or 1. The prefix refers to the part of the word prior to the last, terminating symbol, and varies in length according to the overall length of the variable length word. In addition, each of the fixed length codes in each of the groups can be further represented based on lexicographic ordering of the fixed length codes relative to a lexicographically ordered first fixed length code, i.e., an offset or base code, in the respective group, as discussed above.

For example, given a lexicographically order first fixed length code 4 corresponding to word 0010 in group (3, 1), 0, and given an index position of the word 1000 represented by code 6 within the group, i.e., 2 of possible index positions 0, 1 and 2, the word for code 6 can be directly computed by simply multiplying the first word 0010 by four, or by some other mathematical operation. This algebraic property may facilitate direct computation of words from codes during decoding operations, given index positions of the codes within the lexicographically order of the codes relative to the first fixed length, or "base" code in the respective group.

To facilitate enumerative coding techniques, in accordance with this disclosure, the length of the prefix, the number of ones in the prefix, and the termination symbol for the one or more codes in each group may be stored in a data structure in memory. In some aspects of this disclosure, the memory may reside within or otherwise be associated with a coding device, such as a media coding device. For example, the fixed length code represented by the data structure may be applied by a media coder to at least one of encode and decode at least one of video data, image data, audio data or speech data. With reference to the video coding examples of FIGS. 1-3, the data structure may reside within or be associated with video encoder 20, video decoder 26 or both. For example, the data structure may be stored in memory 47 or memory 53 of FIGS. 2 and 3, respectively. Video encoder 20 and video decoder 26 may access the data structure to encode variable length words with fixed length codes, and decode fixed length codes to produce variable length words. More particularly, one or more processors associated with entropy encoding unit 46 and entropy decoding unit 52 may access such a data structure, e.g., in respective memories 47 and 53, to perform entropy encoding and decoding, respectively.

In the example of FIGS. 4 and 5 and Table 1, the VF coding tree includes a small number of codes and input words with relatively short lengths for ease of illustration. In practice, however, a VF coding tree constructed according to various aspects of this disclosure may include hundreds or thousands of codes and input words, some of which may include much longer code and/or word lengths. Accordingly, consumption of memory space to represent a set of VF codes may be a concern. As described in this disclosure, application of enumerative techniques, utilizing algebraic properties of a VF coding tree, may permit the use of memory efficient data structures, thereby conserving memory space. For example, it may be possible that the data structure requires at most an amount $O(L^2)$ of space in the memory, in Bachmann O notation, where L is the depth of the variable-to-fixed length coding tree defining the arrangement of the fixed length codes for a memoryless source.

An example of application of a compact data structure and C code for implementing a construction procedure for a binary memoryless sources is described below. In general, the C code below outlines a process for constructing VF codes consistent with a VF coding tree defined by a data structure. As described above, the data structure may specify a length l of a prefix of each of variable length words represented by the fixed length codes in the group, a number k of ones in the prefix of each of the variable length words represented by the fixed length codes in the group, and a termination symbol a of each of the variable length words represented by the fixed length codes in the group. The l and a values are shown as "l" and "a," respectively, in the example code below.

In addition, the data structure may specify an offset that indicates the code representing the lexicographically first word in each group. The lexicographically first word in each group may be the smallest word in the group. In other implementations, however, the lexicographically first word in each group may be the largest word in the group. Use of the code of the lexicographically smallest word as the offset will be described in this disclosure for purposes of illustration. As discussed above, however, the ordering of a group could be reversed such that the offset specifies the code of the lexicographically largest word in the group. Hence, this exemplary description should not be considered limiting of the techniques as broadly described in this disclosure.

| Enumerative Construction of VF Codes |
|---|

```
/* VF-Code Group structure: */
typedef struct {
    unsigned char l,k,a; /* l - prefix length; k - # of ones; a -
    last symbol */
    unsigned int offset; /* code of the lexicographically smallest
    word in the group */
} VFCG;
int make_code (double p, double N, int L, VFCG *vfcg)
{
    int k,l,j=0,M=0; // j = group #; M = # of codewords
    for (l=0; l<=L; l++) { // l = length of words w; L = max. length
        for (k=0; k<=l; k++) { // k = number of ones in w
            /* compute probability of an l-bit word with k ones: */
            double pr = pow(p,k) * pow(l-p,l-k);
            /* internal nodes? */
            if (pr >= 1/(N * p)) {
                /* check if left extensions turn into leaves: */
                if (pr < 1/(N * p * p)) {
                    /* register an l,k,0 group: */
                    vfcg[j].l = l; vfcg[j].k = k; vfcg[j].a = 0;
                    vfcg[j].offset = M;
                    j ++;
                    M += binomial(l,k);
                } /* check if right extensions turn into leaves: */
                if (pr < 1/(N * p * (1-p))) {
                    /* register an l,k,l group: */
                    vfcg[j].l = l; vfcg[j].k = k; vfcg[j].a = 1;
                    vfcg[j].offset = M;
                    j ++;
                    M += binomial(l,k);
                }
            }
        }
    }
    /* set end-of-list record & return # of codewords */
    vfcg[j].offset = M;
    return M;
}
```

The above code may be executed by a processor residing within or associated with a coding device, such as a media coding device for coding video data, image data, speech data and/or voice data. Alternatively, or additionally, the above code may be executed in one or more processors independent of such a coding device to generate a VF data structure and contents that define the VF coding tree. The term "processor" may generally refer to one or more processors with the understanding that the various functions described in this disclosure may, but need not, be performed by a single processing unit. Accordingly, the term "processor" will be used herein to refer to a single processor or multiple processors, which may take any of a variety of forms, such as one or more digital signal processors (DSPs), general purpose microprocessors, application specific integrated circuits (ASICs), field programmable logic arrays (FPGAs), any combinations thereof, or other combinations of equivalent integrated or discrete logic circuitry.

Upon enumerative construction of the VF codes, the resulting VF data structure and its contents may then be loaded in a memory associated with a coding device, e.g., for access and use by one or more processors configured to perform VF encoding, VF decoding, or both. For example, memory residing within or associated with video encoder 20 and video decoder 26 may store the data structure and associated contents for use in encoding and decoding, respectively. In some cases, the data structure stored by video encoder 20 and video decoder 26 may be the same data structure or a different data structure conveying sufficient information to permit encoding or decoding, as applicable.

In the above code, the VF coding tree is assumed to have a maximum of L levels in the tree. The prefix length l in the VF coding data structure coincidentally designates the corresponding level in the tree. While the prefix length l is not greater than the maximum length L, a processor executes the above code and considers words having prefixes with 0 ones and 1 one in the prefix of the respective word. The processor computes the probability of each applicable l-bit word with k ones with the double precision value $Pr=pow(p,k)*pow(1-p, 1-k)$, where p is the probability of 1s.

If the probability Pr is greater than or equal to $1/(N*p)$, a processor executing the above code checks to see if left extensions within the VF coding tree turn into leaves. For example, as indicated by the above code, if the probability is less than $1/(N*p*p)$, the processor registers an l, k, 0 group, i.e., a group with prefix length l, number of ones in prefix k, and a terminating symbol a of 0. The values of l, k and a are recorded by the processor in an array designated by vfcg[j].l, vfcg[j].k and vfcg[j].a, respectively, where j is the group number or index and vfcg represents the array of VF code group parameters. In addition, the processor records the offset value M, the number of the particular code, in the array as designated by vfcg[j].offset. The processor then increments the group number j and the code number M, where the code number M is a binomial function of l and k.

If the left extensions do not turn into leaves, i.e., if Pr is not less than $1/(N*p*p)$, the processor determines whether the right extensions turn into leaves. In the example code, the processor determines whether Pr is less than $1/(N*p*(1-p))$. If so, the processor registers an l, k, 1 group, i.e., a group with prefix length l, number of ones in prefix k, and a terminating symbol a of 1. The processor then records the l, k and a values in the array designated by vfcg[j].l, vfcg[j].k and vfcg[j].a, respectively. The processor also records the offset value M, the number of the particular code, in the array as designated by vfcg[j].offset. The processor then increments the group number j and the code number M, where the code number M is a binomial function of l and k. The process continues for successive levels in the tree, and successive groups, resulting in a vcfg[j] values for intermediate leaves, and vcfg[j].offset value for the final leaf, which is equal to the then-current value of M.

An example encoding procedure using a VF coding tree constructed in accordance with this disclosure will now be described. In general, the encoding procedure may include obtaining variable length words having a lexicographic order, and encoding each of the variable length words with one of a plurality of fixed length codes. In accordance with the VF coding tree, the fixed length codes are arranged in groups, each of the groups including one or more fixed length codes representing variable length words for which a probability is the same and for which a termination symbol is the same. The one or more fixed length codes in each of the groups are arranged in the lexicographic order of the variable length words they represent.

Encoding the variable length words may comprise selecting the fixed length codes based on a length of a prefix of each of variable length words represented by the fixed length codes in the respective group, a number of ones in the prefix of each of the variable length words represented by the fixed length codes in the respective group, and a termination symbol of each of the variable length words represented by the fixed length codes in the respective group. The prefix length, number of ones, and terminating symbol associated with the list of groups making up the VF coding tree may be stored in or more data structures. The data structures may be stored in memory residing within or other accessible by an encoding device, which may be a media coder such as video encoder 20 of FIG. 2, for retrieval during the encoding procedure. More particularly, the encoding device may be one or more processors associated with an entropy coding device such as entropy encoding unit 46 of FIG. 2.

The coding device may select each of the fixed length codes in each of the groups based on lexicographic ordering of the fixed length codes relative to a lexicographically ordered first fixed length code in the respective group. The lexicographically ordered first fixed length code may be considered an offset code or base code for the group. The offset or base code represents the lexicographically ordered first variable length word among the words represented by the codes in the particular group. The offset or base code may permit computation of codes based on index positions of the codes in the code group relative to the base code at the first index position for the code group.

In general, the prefix length, number of ones in the prefix, and terminating symbol for a variable length word may be used to select a group of fixed length codes associated with those characteristics. Using the lexicographic ordered position of the variable length word relative to the lexicographically ordered position of the variable length word associated with the first, offset or base code in the group, the coding device can select the index position of the code. Using the index position, the coding device can compute the appropriate code, e.g., by adding to the base code the difference between the index position of the code and the index position of the base code. The result is the correct fixed length code for the variable length input word.

As mentioned above, the prefix length, number of ones in the prefix, and the termination symbol for a group may be stored from a data structure stored in a memory. Notably, as a result of the enumerative construction techniques, the group list defined by the data structure may requires at most an amount $O(L^2)$ of space in the memory, in Bachmann O notation, wherein L is a depth of the variable-to-fixed length coding tree defining the arrangement of the fixed length codes for a memoryless source. Although the encoding procedure may be generally applicable to a variety of data, in some applications, the variable length words may represent at least one of video data, image data, audio data or speech data, and the encoding procedure may further comprise encoding the variable length words to encode the one of video data, image data, audio data or speech data.

Set forth below are examples of C code for implementing procedures for encoding and decoding VF codes using a data structure constructed as described in this disclosure. For simplicity, the encoding and decoding procedures are described using simple linear search techniques for identifying matching groups. The number of search items in each case, encoding and decoding, is at most $O(L^2)$, in Bachmann's notation, where L represents the depth of the VF coding tree.

The use of a binary search, which is particularly easy to apply in the decoding procedure, will result in $O(\log L)$ steps, which is much faster than the $O(L)$ steps that ordinarily would have been needed to parse a conventional VF coding tree. In order to compute a code for a word w belonging to a group $X_{l,k,a}$, the encoding procedure may be configured to compute lexicographic index of an l-bit prefix of w in a set of all l-bit long words with k ones. This process is denoted in the C code of the encoding procedure below as index (l, k, w). Similarly, the decoding procedure may be configured to use the reverse process, denoted in the C code of the decoding procedure below as word (l, k, i), which generates the i-th word from a lexicographically ordered set of l-bit sequences with k ones.

Example C code for a VF encoding procedure is outlined below:

---
Encoding of VF Code Using List of Groups in Coding Tree
---
```
/* Variable-to-fixed-length encoder: */
void vfcg_encode (BITSTREAM *in, unsigned *code, VFCG *vfcg)
{
    unsigned l, k, j, i, w;
    for (l=0,k=0,j=0,w=0; ; ) {
        i = get_bit(in); // read next bit
        while (l == vfcg[j].l) { // see if we have a match
            if (k == vfcg[j].k && i == vfcg[j].a)
                goto found;
            j ++;
        }
        w = w *2 + i; k += i; l ++; // include l-th bit in prefix
    }
found:
    i = index(l,k,w); // get lexicographic index of the prefix
    *code = vfcg[j].offset + i // compute codeword
}
```
---

In the C code above, a processor associated with an encoder, such as video encoder 20 or another media encoder, receives an input word w to be encoded, wherein i=get_bit(in) represent the reading of bits from the input word w. If the length l of the prefix is equal to the prefix length vfcg[j].l designated for a current group, the number k of ones in the prefix is equal to vfcg[j].k designated for the current group, and i is equal to the terminating bit vfcg[j].a designated for the current group, then the process has found a matching code for the input word. In this case, the processor proceeds to "found," where it determines the lexicographic index of the prefix according to i=index (l, k, w), and computes the appropriate VF code for the input word.

For example, the processor may calculate the code based on the lexicographic index of the prefix within the group. In this case, the code corresponds to the code at the lexicographically first position vfcg[j].offset plus the index value i. Hence, with reference to FIG. 5, if the current group is the (3, 1), 1 group and the lexicographic index of the code is 2, out of three possible index positions 0, 1 and 2, then the code is the offset (base) code 7 plus the index value 1, which is equal to code 8. Similarly, if the index value was 2, the code would be the offset or base code 7 plus 2, which is equal to 9.

If length l does not match the prefix length vfcg[j].l, then the processor increments the length l(l++). The processor also sums the value of k with the bit i(k+=i), and adds the bit I to the prefix (w=w*2+i). The result is that the l-th bit is added to the prefix. The processor then repeats the search process to determine whether there is a match in a group at the next level. In particular, the processor again determines whether the updated length l of the prefix is equal to the prefix length vfcg[j].l designated for a current group, the updated number k of ones in the prefix is equal to vfcg[j].k designated for the current group, and the updated terminating bit i is equal to the terminating bit vfcg[j].a designated for the current group. If so, the process has found a matching code for the input word, and generates the code as described above with respect to "found."

The processor may apply the same general process for each variable length input word to generate a pertinent fixed length code. The data structure resulting from the enumerative construction of the VF codes can facilitate encoding of input words while reducing overall memory requirements. In particular, arranging the codes into groups with corresponding prefix lengths, number of prefix zeros, and terminating bits permits relatively rapid generation of codes with memory space on the order of $O(L^2)$, rather than $O(2^L)$.

An example decoding procedure using a VF coding tree constructed in accordance with this disclosure will now be described. In general, the encoding procedure may comprise obtaining fixed length codes, and decoding the fixed length codes to produce variable length words having a lexicographic order. In accordance with enumerative construction techniques described in this disclosure, the fixed length codes may be arranged in groups. Each of the groups includes one or more fixed length codes representing variable length words for which a probability is the same and for which a termination symbol is the same. In addition, the one or more fixed length codes in each of the groups are arranged in the lexicographic order of the variable length words they represent.

A decoding device, which may be a media decoder such as video decoder 26 of FIG. 3, may decode a respective one of the fixed length codes using a data structure representing various attributes of the VF coding tree. More particularly, the coding device may be an entropy encoding device such as entropy encoding unit 46 of FIG. 2. The decoding device may identify one of the groups including the respective fixed length code based on a comparison of the respective code to a lexicographically ordered first code in the identified group. The lexicographically ordered first code in the group may be considered an offset or base code. The decoding device may determine a lexicographic index of the respective code (to be decoded) within the identified group.

The lexicographic index may be determined, for example, based on a difference between the respective code and the lexicographically ordered first base code in the respective group. The lexicographically ordered first code represents the first variable length word among the lexicographic order of the variable length words represented by fixed length codes in the group, and may be considered a base code for the group. The decoding device then may generate a respective one of the variable length words based on the lexicographic index of the respective code within the identified group. For example, the decoding device may generate the variable length word for the fixed length code to be decoded by determining a prefix of the variable length word represented by the respective code based on the lexicographic index, determine the termination symbol for the identified group, and append the termination symbol to the prefix to form the variable length word.

Again, to facilitate decoding, each of the groups may be defined by a length of the prefix of each of variable length words represented by the fixed length codes in the group, a number of ones in the prefix of each of the variable length words represented by the fixed length codes in the group, and a termination symbol of each of the variable length words represented by the fixed length codes in the group. These attributes may be stored in a data structure in a memory residing within or associated with the coding device.

As described above, the data structure may require at most an amount $O(L^2)$ of space in the memory, in Bachmann O notation, and wherein L is a depth of a variable-to-fixed length coding tree defining the arrangement of the fixed length codes for a memoryless source. Although the decoding procedure may be generally applicable to a variety of data, in some applications, the variable length words generated by the decoding procedure may represent at least one of video data, image data, audio data or speech data. Accordingly, the decoding procedure may further comprise decoding the fixed length codes to produce variable length words representing one of video data, image data, audio data or speech data.

Example C code for a VF decoding procedure is outlined below:

---

Decoding of VF Code Using List of Groups in Coding Tree

```
/* Variable-to-fixed-length decoder: */
void vfcg_decode (unsigned *code, BITSTREAM *out, VFCG *vfcg)
{
    unsigned i, j, w;
    for (j=0; code < vfcg[j+1].offset; j++) ; // find a subgroup containing
    the code
    i = code - vfcg[j].offset; // i = lexicographic index of a word in
    (l, k) set
    w = word(vfcg[j].l,vfcg[j].k,i); // generate i-th word in an (l,k) set
    w = w * 2 + vfcg[j].a; // append last bit
    put_bits(w, vfcg[j].l+1, out); // output decoded word
}
```

---

In the C code above, a processor associated with a decoder, such as video decoder 26 or another media decoder, receives a fixed length code to be decoded. The processor searches for a group containing the code within the VF coding tree using a data structure constructed as described in this disclosure. Using a group index j, for a list of groups in the VF coding tree, the search continues until the code is found to be less than the offset code, i.e., the lexicographically first code vfcg[j+1].offset in the next (i+1) group.

The processor increments the group index j until the appropriate group is found. If the current code to be decoded is found to be less than the offset code vfcg[j+1].offset for the (i+1)th group, then the processor determines that the code resides in the jth group, i.e., the group immediately preceding the (i+1)th group. As an example, with reference to the VF coding tree of FIG. 5, if the code is code 8, the processor continues to increment the j index while comparing code 8 to the offset for each (i+1)th group. The code 8 does not become less than the offset code for the (i+1)th group until the j index indicates the (4,0),1 group, which has a base code of 10. At this point, processor determines that code 8 is in the immediately preceding jth group, which is group (3, 1),1.

The processor then determines the lexicographic index of the code by subtracting the offset code vfcg[j].offset for the jth group from the code being decoded. For group (3, 1), 1, the offset. If the code to be decoded is code 8, then the index i of code 8 within group (3, 1), 1 is 8−7=1, out of possible indices 0 for the base code 7, 1 for code 8, and 2 for code 9. Using the index i, the processor generates the ith word w in the (l, k) set, where w=word (vfcg[j].l, vfcg[j].k, i). The processor then appends the terminating bit by multiplying the word w by two to shift it one place to the left and adding the terminating bit vfcg[j].a. The variable length word produced from the fixed length code is then output, e.g., by the command put bits (w, vfcg[j].l+1, out).

As mentioned previously, for reasonably short words, e.g., l less than or approximately equal to 12, computation of their lexicographic indices (or synthesis of words, using their indices) can be a matter of a single lookup. For longer words, it is possible to use the following well-known combinatorial formula $$\text{index}(l, k, \omega) = \sum_{i=1}^{l} \omega_j \binom{l-j}{\sum_{k=j}^{l} \omega_k} \quad (15)$$

where $w_j$ represent individual bits of the word w, and it is assumed that $$\binom{l}{k} = 0$$

for all k>1. The combinatorial formula (15) has been discussed, for example, in V. I. Mudrov, An algorithm for enumeration of combinations, Vyc. Math. and Math. Phys., 5 (4) (1965) 776-778 (in Russian); V. F. Babkin, A method of universal coding with non-exponent labour consumption, Probl. Inf. Trans., 1 (4) (1971) 13-21 (in Russian); J. P. M. Schalkwijk, An Algorithm For Source Coding, IEEE Trans. Inf. Theory, 18 (3) (1972), 395-399; T. M. Cover, Enumerative Sources Encoding, IEEE Trans. Inf. Theory, 19 (1) (1973) 73-77; Tj. J. Tjalkens, The Complexity of Minimum Redundancy Coding, in Proc. 21-th Symp. Inf. Theory in the Benelux (May 2000) 247-254; and T. Tjalkens, Implementation cost of the Huffman-Shannon-Fano code, in Proc. Data Compression Conference (DCC'05) (Snowbird, Utah, Mar. 29-31, 2005) 123-132. In order to implement this combinatorial formula, an approach would be to either pre-compute all binomial coefficients up to level l in Pascal's triangle, or compute them dynamically, using the following simple identities:

$$\binom{l-k}{k-1} = \frac{k}{l}\binom{l}{k} \text{ and } \binom{l-k}{k} = \frac{l-k}{l}\binom{l}{k}.$$

The implementation based on pre-computed coefficients generally requires $$\frac{l(l+1)}{2} = O(l^2)$$

words of memory and O(1) additions. Dynamic computation of coefficients will generally require O(1) additions, multiplications and divisions. However, the entire process ordinarily will require only a few registers.

Figure 6:
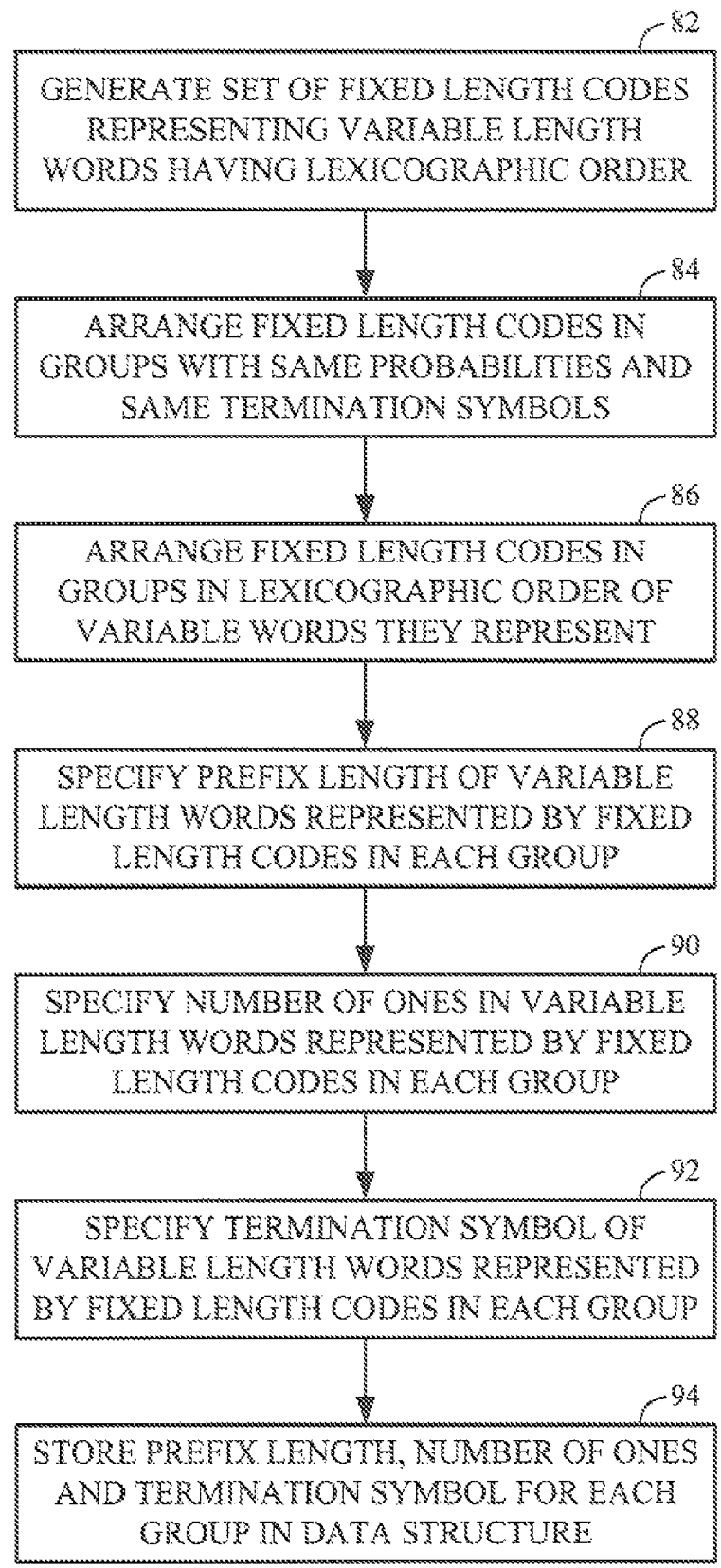
FIG. 6 is a flow diagram illustrating a method for memory efficient construction of VF codes.

FIG. 6 is a flow diagram illustrating a method for memory efficient construction of VF codes. The method illustrated in FIG. 6 is an example of the VF code construction techniques described in this disclosure. The method may be implemented by one or more processors associated with an encoder, decoder, or associated with another device to construct VF codes for use by an entropy encoding unit 46 and entropy decoding unit 52, as shown in FIGS. 2 and 3, and may support compression and coding of any of a variety of data, including but not limited to video, image, speech and audio data. Throughout this disclosure, the term processor may refer to one or more processors, and any of a variety of types of processors, as described in detail elsewhere. In any event, such a processor may be provided, for example, within an encoder or decoder, or within a general purpose computing system, e.g., to prepare a data structure defining code structure attributes useful in VF coding.

As shown in FIG. 6, a processor obtains a set of variable length words having a lexicographic order and generates a set of fixed length codes representing such variable length words (82). The words have respective prefix lengths, numbers of ones in the prefixes, terminating symbols, and probabilities. The processor arranges the fixed length codes in groups containing fixed length codes that represent variable length words with same probabilities and same termination symbols (84). In addition, the processor arranges the fixed length codes in each of the groups in the lexicographic order of the variable length words they represent (86).

The processor specifies a prefix length of each of the variable length words represented by the fixed length codes in each group (88). In addition, the processor specifies a number of ones in the prefixes of the variable length words represented by the fixed length codes in each group (90). The processor also specifies a termination symbol associated with the variable length words represented by the fixed length codes in each group (92). The processor stores the resulting prefix length, number of ones and termination symbol for each group in a data structure (94). The data structure may be stored in memory and used by a processor associated with an encoding device or a decoding device to represent the VF coding tree to facilitate encoding and decoding procedures, respectively.

Figure 7:
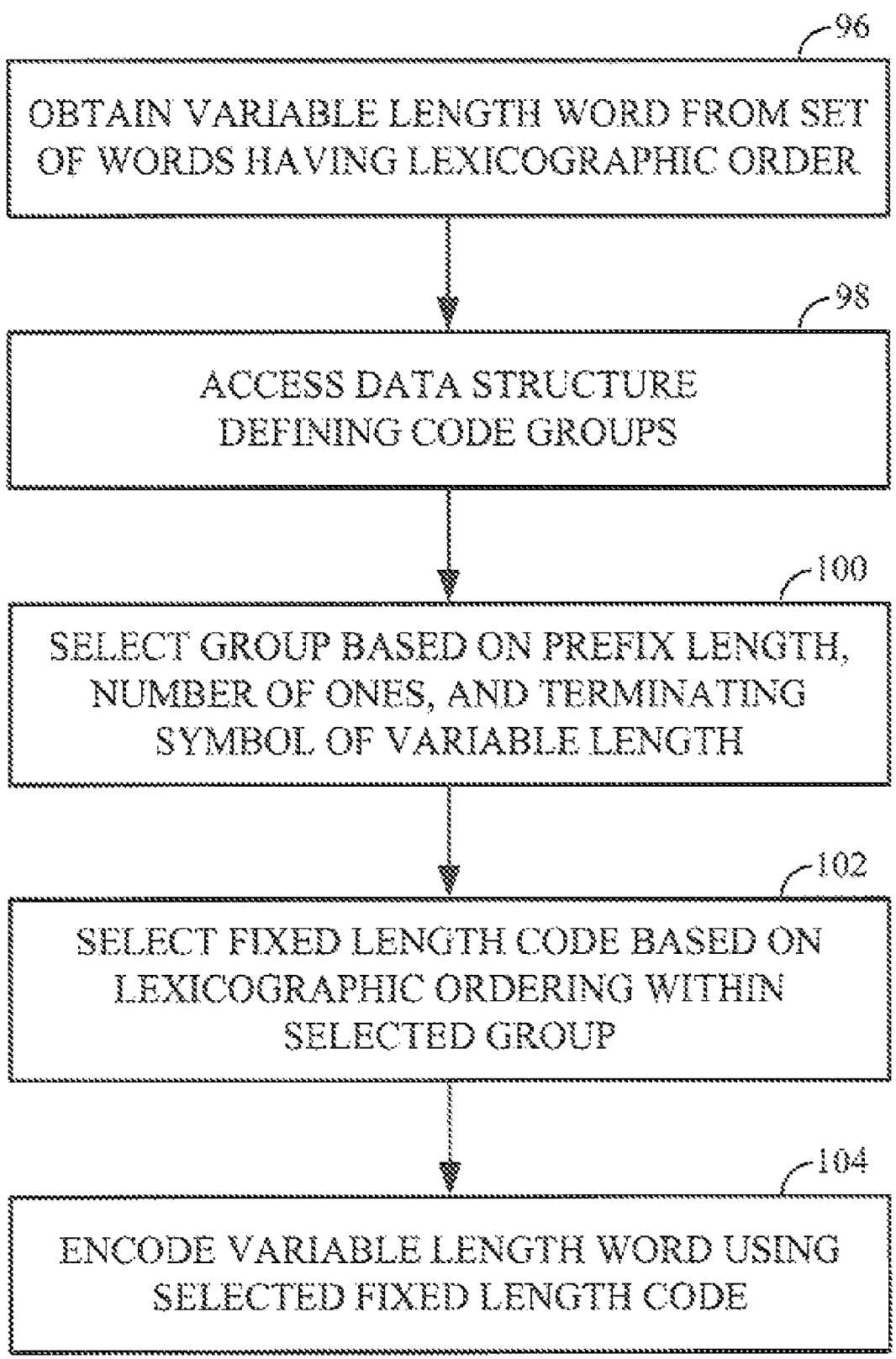
FIG. 7 is a flow diagram illustrating a method for encoding words using VF codes constructed according to the method of FIG. 6.

FIG. 7 is a flow diagram illustrating a method for VF coding in the form of encoding symbols using VF codes constructed according to the method of FIG. 6. The method illustrated in FIG. 7 is an example of the VF encoding techniques described in this disclosure. The method of FIG. 7 may be implemented by a processor, i.e., one or more processors, associated with an encoding device, such as a media encoding device. Examples of media encoding devices include video encoder 20, or other encoders useful in encoding a variety of data such as video, image, speech and/or voice data.

As shown in the example of FIG. 7, an encoding device may obtain a variable length word to be encoded with a fixed length code (96). The variable length word may form part of an input set of words having a particular lexicographic order. In addition, the words may have associated prefix lengths, numbers of ones in the prefix, terminating symbols, and probabilities, e.g., as indicated in the example of Table 1. To encode the variable length word, the encoding device may access a data structure defining the code structure, e.g., in terms of fixed length code groups (98) within a VF coding tree, as described in this disclosure.

Using the data structure, the encoding device may select one of the groups of codes in the coding tree. For example, the encoding device may select one of the groups based on a prefix length, number of ones in the prefix, and terminating symbol of the variable length word to be encoded (100). The encoding device may then select one of the fixed length codes in the selected group. For example, the encoding device may select one of the fixed length codes in the selected group based on a lexicographic ordering within the selected code group (102).

As an illustration, the codes may be arranged in the lexicographic order of the words they represent. Accordingly, the position of the appropriate code in the group may be determined by the lexicographic position, or "index," of the prefix of the variable length word to be encoded, relative to the other variable length words represented by codes in the selected group. Using this lexicographic index, the encoding device encodes the variable length word using the selected fixed length code (104). The encoding device may determine the lexicographically ordered first code, i.e., the base code, for the group, and then add to the base code the difference between the index of word represented by the base code and the index of the word to be encoded, or simply the index if the base word index is 0.

In this example, the encoding device encodes the word as the sum of the base code and the lexicographic index of the word to be encoded. As previously described, with reference to FIG. 5, if the current group is the (3, 1), 1 group and the lexicographic index of the code is 2, out of three possible index positions 0, 1 and 2, then the code is the offset code 7 plus the index value 1, which is equal to code 8. Similarly, if the index value was 2, the code would be the offset code 7 plus 2, which is equal to 9. In each case, the attributes stored in the memory efficient data structure facilitate encoding of the variable length words into fixed length codes according to the VF coding tree.

Figure 8:
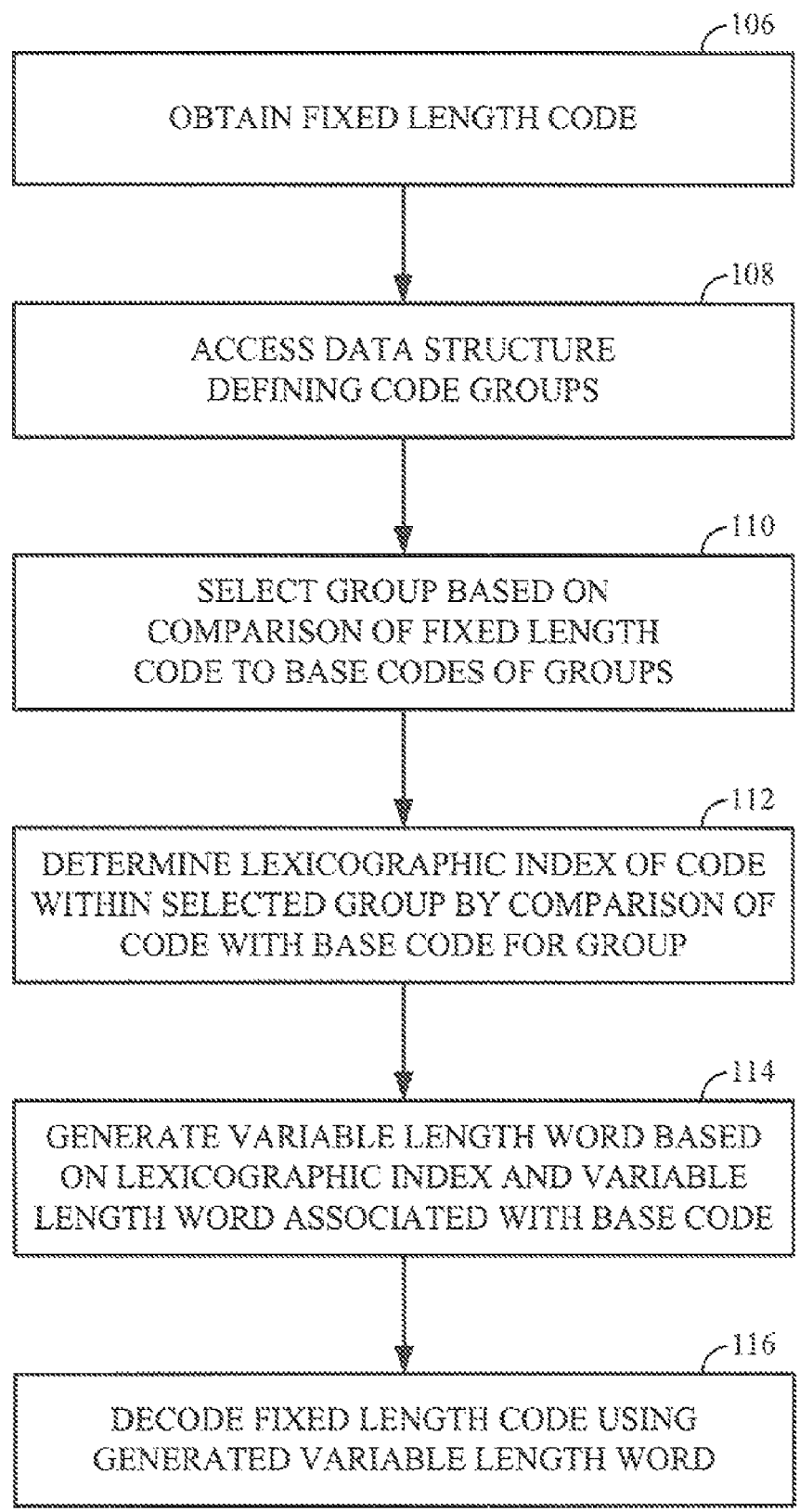
FIG. 8 is a flow diagram illustrating a method for decoding VF codes constructed according to the method of FIG. 6.

FIG. 8 is a flow diagram illustrating VF coding in the form of a method for decoding VF codes constructed according to the method of FIG. 6. The method illustrated in FIG. 8 is an example of the VF decoding techniques described in this disclosure. The method of FIG. 8 may be implemented by a processor, i.e., one or more processors, associated with a decoding device, such as a media decoding device. Examples of media decoding devices include video decoder 26, or other decoders useful in decoding a variety of data such as video, image, speech and/or voice data.

As shown in FIG. 8, the decoding device obtains a fixed length code to be decoded (106) to produce a corresponding variable length word represented by the code. The decoding device accesses a data structure defining code groups (108) according to the VF coding tree. The data structure may specify prefix lengths, numbers of ones in prefixes, terminating symbols and probabilities for variable length words represented by fixed length codes in each of the groups. Using the data structure, to decode the fixed length code, the decoding device selects a group based on a comparison of the fixed length code to base codes of the groups in the tree (110).

For example, the decoding device may conduct a top-down search through the base codes associated with the j groups in the tree. The search terminates when the decoding device identifies a base code that is larger than the code to be decoded. The group associated with the identified base code is the (j+1)th group, and the code to be decoded then belongs to the jth group. As an illustration, with reference to FIG. 5, if the fixed length code to be decoded is code 9, the search examines base codes for each of the groups starting with the first group. When the search reaches group (3, 0),1, it determines that code 10 is greater than code 9, and that code 9 therefore belongs in the immediately preceding group, which is group (3, 1), 1, given the ordering of the groups according to the lexicographic ordering of the words represented by the codes in the groups.

Upon selecting a group, the decoding device determines the lexicographic index of the code within the selected group by comparison of the code to the base code for the group (112). If the base code for group (3, 1), 1 is 7, and the code to be decoded is 9, then the lexicographic index of code 9 is 2, i.e., the difference between 7 and 9. Using the lexicographic index of the code, the decoding device generates the corresponding variable length word. For example, the decoding device may generate the variable length word based on the lexicographic index of the code, and the variable length word represented by the base code for the group (114).

Hence, with reference to FIG. 5, if base code 7 represents variable length word 0011, having a prefix of 001, and the lexicographic index of code 8 is 1, then the decoding device may add the index of 1 to the prefix 001 to produce 010. The decoding device may then append the terminating bit (1) for the group to produce a variable length word of 0101 for fixed length code 8. The decoding device then decodes the fixed length code using the generated variable length word (116). In other words, the decoding device outputs the generated variable length word, e.g., 0101 in this example, as the decoded output of the fixed length code, e.g., code 8 in this example.

A code structure may be defined by a data structure stored in any of a variety of computer-readable media, including memory or data storage media, as described in this disclosure. For example, a computer-readable medium may comprise a data structure representing a set of fixed length codes representing variable length words having a lexicographic order. The fixed length codes are arranged in groups, wherein each of the groups includes one or more fixed length codes representing variable length words for which a probability is the same and for which a termination symbol is the same. In addition, the one or more fixed length codes in each of the groups are arranged in the lexicographic order of the variable length words they represent.

In accordance with this disclosure, techniques for parsing of VF codes are provided. The examples described below use the VF code of the VF coding tree of FIG. 5. One of ordinary skill in the art will recognize that other VF codes may be used in conjunction with the described parsing techniques. VF codes allow for access to (and immediate decoding of) an arbitrary fixed length code in a compressed bitstream that is made up of a plurality of fixed length codes (e.g., 1, 2, 5, 7, 8). The compressed bitstream may be an encoded representation of an uncompressed bitstream that is made up of a plurality of variable length words (e.g., 011, 101, 0100, 0011, 0101). However, the position of a produced variable length word in the uncompressed bitstream is not known as the bits preceding the produced variable length word in the uncompressed bitstream are not known. For example, the fixed length code 2 in the example sequence may be decoded to produce word 101. However, without decoding the fixed length code 1 which comes before 2 in the example sequence, it is not known at what position in the uncompressed bitstream that the word 101 belongs. One method for determining the position of word 101, would be to decode fixed length code 1 to produce word 011. Accordingly, it would be determined that the position word 101 starts at the 4th bit of the uncompressed bitstream as the length of word 011 is 3. The complexity for decoding a VF code is O(D), in Bachmann's O notation, where D is the expected decoded phrase length.

However, in order to determine the position of a variable length word in the uncompressed bitstream, it is only necessary to know the lengths of the words that correspond to the fixed length codes that come before the fixed length code arbitrarily chosen to be decoded. The provided techniques of parsing the compressed stream, gives the length of variable length words associated with each of the fixed length codes in the compressed stream, without requiring the fixed length codes to be decoded. In some embodiments, the parsing techniques described may be used with standard search algorithms. Accordingly, the complexity of the parsing technique may be, for example, approximately O(log(log(D))) when an interpolation search algorithm is used, or O(log(D)) when a binary search algorithm is used.

Example pseudo-code for a VF parsing procedure is outlined below. The example procedure selects base codes as described above and produces code indices corresponding to the base codes. The indices are stored in array level_offset[ ].

---

Parsing of VF Code Using List of Base Codes for Each Level

```
/*
* Computes indices for base codes for each level:
*/
int compute_level_offsets(int M, int L, VFCG *vfcg, unsigned
*level_offset)
{
    int j, l; // j - group number, l - level number
    for (l=0;l<L; l++) level_offset[l] = M;
    for (j=0, l=0; vfcg[j].offset < M; j++) {
        if (level_offset[vfcg[j].l] > vfcg[j].offset) {
            level_offset[vfcg[j].l] = vfcg[j].offset;
            if (l < vfcg[j].l)
                l = vfcg[j].l;
        }
    }
    return l; // returns maximum length of a variable length word
}
```

---

An example algorithm for parsing VF codes using the list of base codes for levels is shown below. This pseudo-code uses a simple sequential search in an array of base codes to identify length of a word corresponding to a VF code. Since the search is sequential, the complexity of this example algorithm is linear O(l), where l is the length of an encoded sequence.

---

```
//*
* Parsing of VF codes - using basic linear search:
*/
void vfcg_parse (unsigned *code, BITSTREAM *out, unsigned
*level_offset)
{
    int l;
    for (l=0; code < level_offset[l+1]; l++) ; // l+1 = level containing
        the code
    scroll bits(l+1, out);          // scroll bitstream to the next codeword
}
```

---

The proposed data structure also supports faster parsing techniques of VF codes. Since level_offset[ ] is essentially an ordered array of code values, a dichotomic search of the array may be performed, for example. Pseudo-code for an exemplary fast parsing routine utilizing dichotomic search is shown below.

---

```
/*
* Fast parsing of VF codes - using dichotomic search
*/
void vfcg_parse_fast (unsigned *code, BITSTREAM *out, int l,
unsigned *level_offset)
{
    int low, high, j;
    low = 0; high = l;
    while (high - low > 1) {
        j = (high - low) /2;
        if (code < level_offset[j])
            high = j;
        else
            low = j;
    }
    scroll bits(low+1, out);   // scroll bitstream to the next codeword
}
```

---

A dichotomic search reduces the complexity of parsing from O(l) to just O(log l) operations, where l is the length of an encoded sequence. Such an algorithm can parse VF codes in sub-linear time, which is much faster than any feasible full decoding process.

It should be recognized that further improvements in speed of parsing of VF codes are fully supported by the above described data structure. For example, interpolation search algorithms may be used for location of word length. Complexity of such algorithms is in the order of O(log log l). Examples of such search algorithms can be found in textbooks on algorithms, such as G. H, Gonnet, "Handbook of algorithms and data structures", Addison-Wesley, 1984, pp 35-37.

One embodiment of a parsing technique is described with regards to the VF code tree of FIG. 5. The technique requires generating a set of base codewords for a given VF code tree. The base codewords are a subset of the set of fixed length codes used in a given VF code. A single base codeword is selected for each level of the VF code tree that contains at least one external node. In some embodiments, the first lexicographically ordered fixed length code at a particular level of the VF code tree is the base codeword for that level. For example, the base codewords of the VF code tree of FIG. 5 would be {0, 1, 3, 10, 11, 12, 13, 14, and 15}. In other embodiments, the base codeword may be the first lexicographically ordered group at a particular level of the VF code tree. For example, the base codewords of the VF code tree of FIG. 5 would be {(1,1),1; (2,1),1; (3,0),1; (4,0),1; (5,0),1; (6,0),1; (7,0),1; (8,0),1; and (9,0),0}. The base codewords are then arranged in a list in lexicographical order. The list may be stored in memory 53 as a linked list, array, or other suitable data structure.

In some embodiments, the base codewords may be associated with a length of the word corresponding to the decoded base codeword. The length of the variable length word associated with a given fixed length code is the level where the fixed length code is located on the VF tree. Therefore, the length of the variable length word associated with a given base codeword is equal to the length of each variable length word associated with each fixed length code at the same level as the base codeword on the VF tree. Utilizing this property, the length of the variable length word associated with a fixed length code can be determined by determining the length of the variable length word associated with the base codeword on the same level of the VF tree as the fixed length code.

In one embodiment of a decoding device of this disclosure, the decoding device may conduct a search through the list of base codewords associated with the levels of a given VF code tree. The search terminates when the decoding device identifies a base codeword that is larger than the code to be parsed, where the identified base codeword is at position x on the list. The decoding device may then look to the largest base codeword that is smaller than the identified base codeword, which is at position x−1 on the list. This base codeword is associated with a variable length word of the same length as that associated with the code to be parsed. For example, the list of base codewords for the VF tree of FIG. 5 may be (0, 1, 3, 10, 11, 12, 13, 14, 15). If 9 is the code to be decoded, the decoding device searches until the base codeword 10 is found. Base codeword 3 is then the largest base codeword smaller than 10. Base codeword 3 is associated with a variable length word of size 4, therefore the length of the variable length word associated with code 9 is also 4.

Memory efficiency is obtained due to the fact that the length of the variable length word associated with each fixed length code does not need to be stored. Rather, the relevant information only needs to be stored for each base codeword. Further, efficiency in determining the position of a word in an uncompressed bitstream is obtained as the position can be determined by parsing the fixed length codes as opposed to decoding each one.

In some embodiments, the compressed bitstream is divided into a plurality of segments. Each segment may include one or more fixed length codes. In some embodiments each segment includes the same number of fixed length codes. In other embodiments, different segments may include a different number of fixed length codes. In some such embodiments, each segment is associated with the length of the uncompressed bitstream associated with the portion of the compressed bitstream that comes before the selected segment. For example, compressed bitstream 2,3,4,5,2,3,4,2,1 may be divided into 3 segments {(2,3,4); (5,2,3); (4,2,1)}. The first segment (2,3,4) would be associated with 0 as no portion of the compressed bitstream comes before the first segment. The second segment (5,2,3) would be associated with 11. This is because the portion of the compressed bitstream before the second segment is (2,3,4), which decoded results in the uncompressed bitstream 10100010011, which has a length of 11. In such embodiments, to find the position of a word corresponding to a randomly selected fixed length code, it is not necessary to parse each fixed length code coming before the selected code, but only those coming before the selected code in the same segment as the selected code. This requires extra memory to store the length of the segments, but reduces the number of fixed length codes that need to be parsed.

Figure 9:
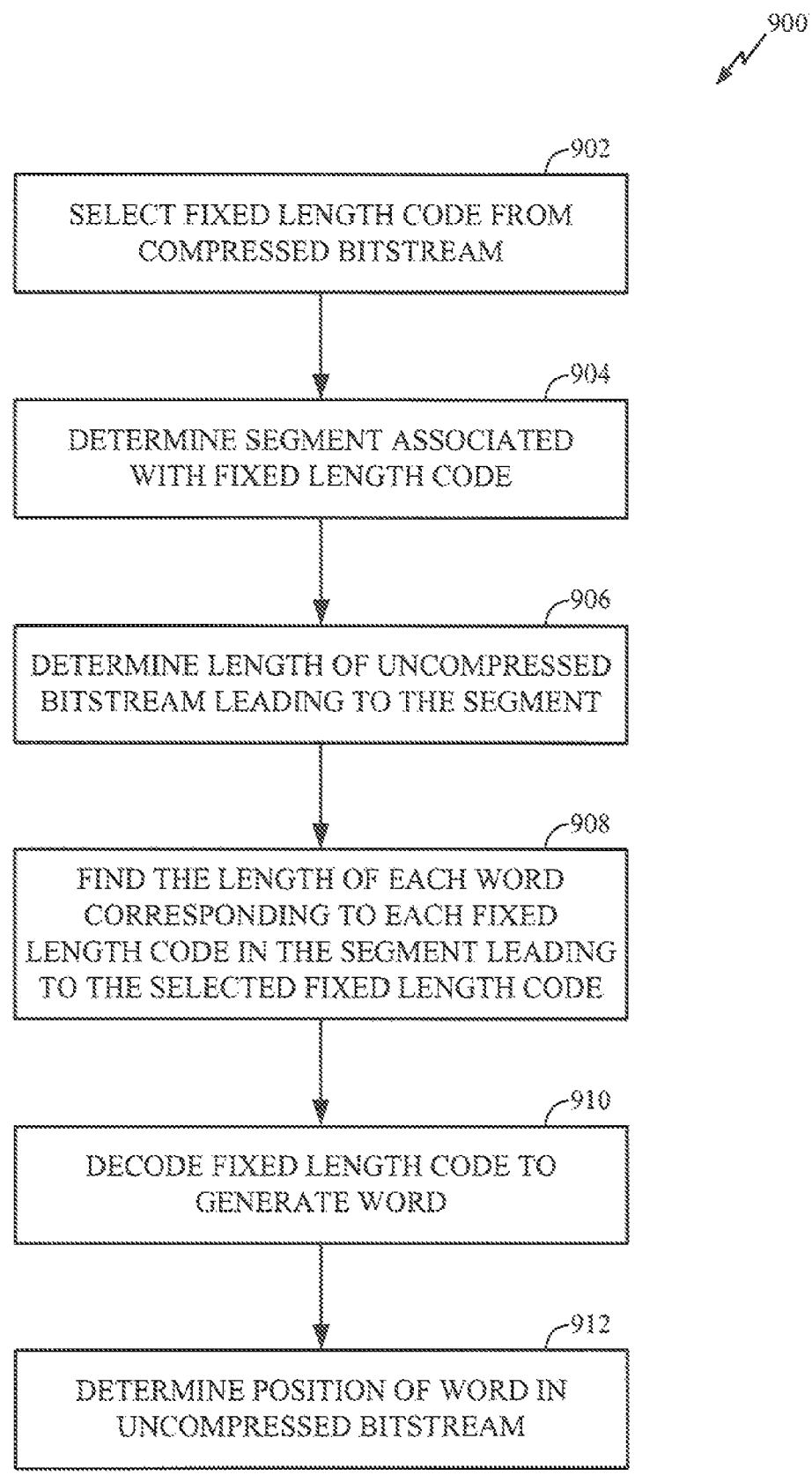
FIG. 9 is a flow diagram illustrating another method for decoding VF codes constructed according to the method of FIG. 6.

FIG. 9 is a flow diagram illustrating VF coding in the form of another method for decoding VF codes constructed according to the method of FIG. 6. Process 900 is an embodiment of a method by which a randomly selected fixed length code from a compressed bitstream is decoded and positioned in the corresponding uncompressed bitstream. In some embodiments, process 900 may be carried out by entropy decoding unit 52. At step 902, the fixed length code is selected from the compressed bitstream. The selected fixed length code may, for example, correspond to data representative of a random frame of video in a video stream. At a next step 904, the segment of the compressed bitstream in which the selected fixed length code is located is determined. At a further step 906, the length of the uncompressed bitstream that corresponds to the portion of the compressed bitstream that comes before the selected fixed length code is determined. As discussed above, in some embodiments this length value is stored in memory 53 and step 906 comprises retrieving the length value from memory 53. Continuing at Step 908, for the segment, the length of each word corresponding to each fixed length code that comes before the selected fixed length code is determined. In one embodiment, the lengths are determined by process 1000 described below with respect to FIG. 10. At a next step 910, the fixed length code is decoded to generate the corresponding word. In some embodiments, decoding is carried out by the method described with respect to FIG. 8. Further, at step 912, the position of the word in the uncompressed bitstream is determined. The position is determined by adding the length value found in step 906, with each of the length values found in step 908. The starting position of the word in the uncompressed bitstream is equal to the summed value+1. In some embodiments, the position of the word may be the position of a frame of video in a stream of video.

It should be noted that in some embodiments, the compressed bitstream is not divided into segments and steps 904-906 are omitted from process 900.

Figure 10:
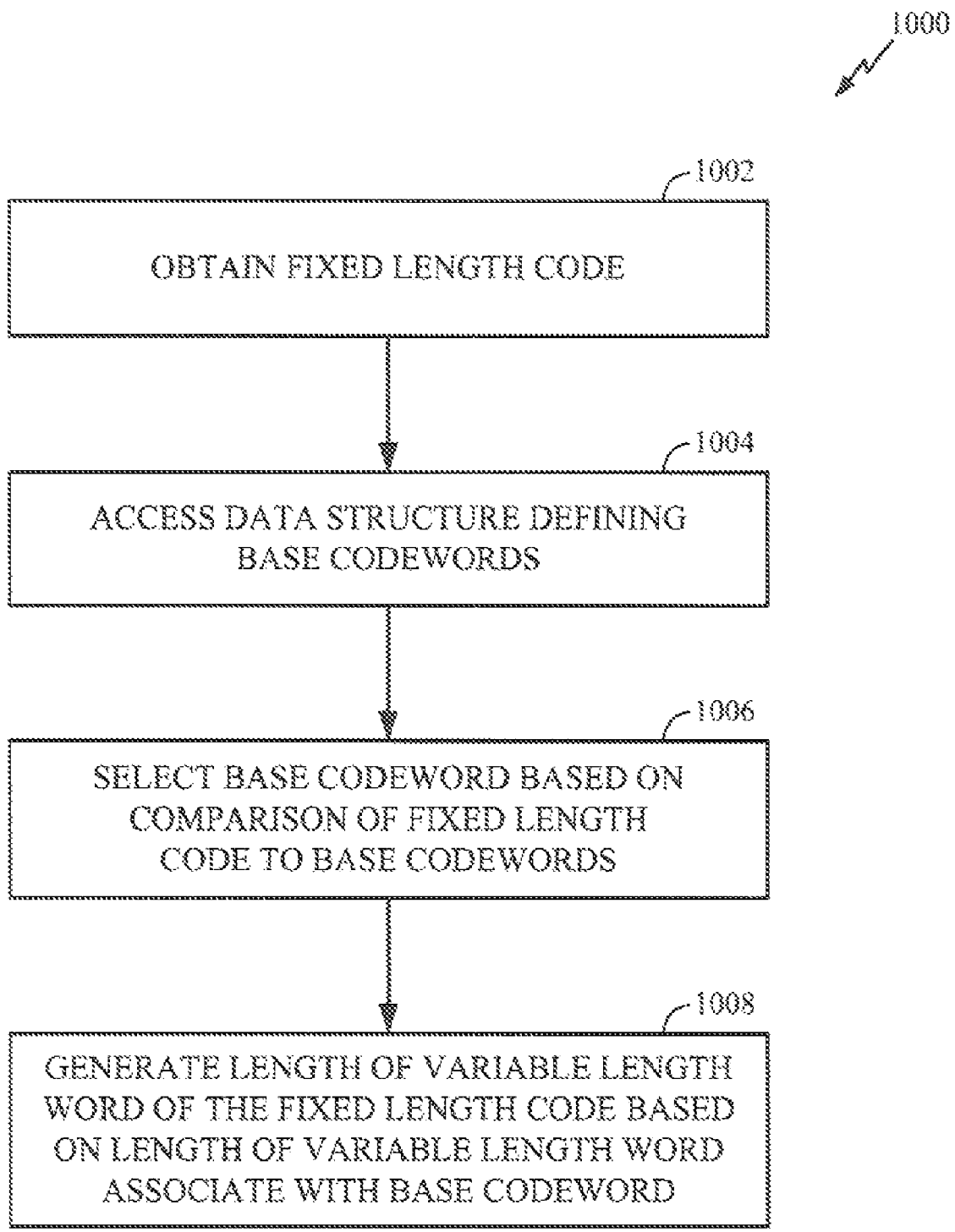
FIG. 10 is a flow diagram illustrating VF parsing in the form of a method for determining the length of words corresponding to VF codes constructed according to the method of FIG. 6.

FIG. 10 is a flow diagram of a process 1000 illustrating VF parsing in the form of a method for determining the length of words corresponding to VF codes constructed according to the method of FIG. 6. In some embodiments, process 1000 is carried out by entropy decoding unit 52. At a step 1002, a fixed length code is obtained. At a next step 1004, the data structure storing the base codewords as described above is accessed. At a further step 1006, a base codeword is selected from the data structure based on the comparison of the fixed length code to the base codewords in the structure. The selected base codeword is the lexicographically largest base codeword that is smaller than the fixed length code. At a next step 1008, the length of the variable length word corresponding to the fixed length code is determined. The length is equal to the length of the variable length word associated with the base codeword. In some embodiments, the length is stored in the structure of the base codewords. The determination in such embodiments comprises retrieving the length from memory.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The techniques described herein may be implemented in hardware, software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein. In addition, in some aspects, the functionality described herein may be provided within dedicated software modules or hardware modules configured for encoding and decoding, or incorporated in a combined video encoder-decoder (CODEC).

Various embodiments of the invention have been described. These and other embodiments are within the scope of the following claims.

What is claimed is:

1. A method comprising:
   storing in memory a data structure that is representative of a list of base codewords in lexicographic order, wherein there is one base codeword for each level of a variable to fixed length code tree that includes a fixed length code;
   selecting a fixed length code from a compressed data set comprising a plurality of fixed length codes;
   determining the based codeword associated with the selected fixed length code; and
   determining the length of a word represented by the selected fixed length code based on the base codeword associated with the selected fixed length code.

2. The method of claim 1, wherein the base codeword for each level of the variable to fixed length code tree that includes a fixed length code is representative of the smallest fixed length code at each level of the variable to fixed length code tree that includes a fixed length code.

3. The method of claim 1, wherein the data structure comprises an array.

4. The method of claim 1, wherein the data structure comprises a linked list.

5. The method of claim 1, wherein the data structure comprises a binary search tree.

6. The method of claim 1, wherein the data structure comprises a digital search tree.

7. The method of claim 1, further comprising determining a segment associated with the selected fixed length code.

8. The method of claim 1, wherein the compressed data set comprises a compressed video stream.

9. An apparatus comprising:
   a memory configured to:
      store a data structure that is representative of a list of base codewords in lexicographic order, wherein there is one base codeword for each level of a variable to fixed length code tree that includes a fixed length code;
   a processor configured to:
      select a fixed length code from a compressed data set comprising a plurality of fixed length codes;
      determine the based codeword associate with the selected fixed length code; and
      determine the length of a word represented by the selected fixed length code based on the base codeword associated with the selected fixed length code.

10. The apparatus of claim 9, wherein the base codeword for each level of the variable to fixed length code tree that includes a fixed length code is representative of the smallest fixed length code at each level of the variable to fixed length code tree that includes a fixed length code.

11. The apparatus of claim 9, wherein the data structure comprises an array.

12. The apparatus of claim 9, wherein the data structure comprises a linked list.

13. The apparatus of claim 9, wherein the data structure comprises a binary search tree.

14. The apparatus of claim 9, wherein the data structure comprises a digital search tree.

15. The apparatus of claim 9, wherein the processor is further configured to determine a segment associated with the selected fixed length code.

16. The apparatus of claim 9, wherein the compressed data set comprises a compressed video stream.

17. An apparatus comprising:
   means for storing in memory a data structure that is representative of a list of base codewords in lexicographic order, wherein there is one base codeword for each level of a variable to fixed length code tree that includes a fixed length code;
   means for selecting a fixed length code from a compressed data set comprising a plurality of fixed length codes;
   means for determining the based codeword associated with the selected fixed length code; and
   means for determining the length of a word represented by the selected fixed length code based on the base codeword associated with the selected fixed length code.

18. The apparatus of claim 17, wherein the base codeword for each level of the variable to fixed length code tree that includes a fixed length code is representative of the smallest fixed length code at each level of the variable to fixed length code tree that includes a fixed length code.

19. The apparatus of claim 17, wherein the data structure comprises an array.

20. The apparatus of claim 17, wherein the data structure comprises a linked list.

21. The apparatus of claim 17, wherein the data structure comprises a binary search tree.

22. The apparatus of claim 17, wherein the data structure comprises a digital search tree.

23. The apparatus of claim 17, further comprising means for determining a segment associated with the selected fixed length code.

24. The apparatus of claim 17, wherein the compressed data set comprises a compressed video stream.

25. A computer-readable medium, comprising instructions that when executed perform a method comprising:

storing in memory a data structure that is representative of a list of base codewords in lexicographic order, wherein there is one base codeword for each level of the variable to fixed length code tree that includes a fixed length code;

selecting a fixed length code from a compressed data set comprising a plurality of fixed length codes;

determining the based codeword associated with the selected fixed length code; and determining the length of a word represented by the selected fixed length code based on the base codeword associated with the selected fixed length code.

* * * * *